US007286403B2

(12) United States Patent
Maejima

(10) Patent No.: US 7,286,403 B2
(45) Date of Patent: Oct. 23, 2007

(54) NON-VOLATILE SEMICONDUCTOR MEMORY DEVICE

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/402,980

(22) Filed: Apr. 13, 2006

(65) Prior Publication Data
US 2006/0250848 A1 Nov. 9, 2006

(30) Foreign Application Priority Data
Apr. 15, 2005 (JP) ............................. 2005-118596

(51) Int. Cl.
*G11C 16/04* (2006.01)
(52) U.S. Cl. ........................... 365/185.17; 365/185.18; 365/185.24
(58) Field of Classification Search ........... 365/185.17, 365/185.18, 185.23, 185.24
See application file for complete search history.

(56) References Cited

U.S. PATENT DOCUMENTS

| 6,363,010 B2 * | 3/2002 | Tanaka et al. ......... 365/185.03 |
| 6,496,418 B2 * | 12/2002 | Kawahara et al. ..... 365/185.24 |
| 7,117,296 B2 * | 10/2006 | Hosono et al. ............. 711/103 |
| 2005/0128843 A1 | 6/2005 | Kajimoto et al. |
| 2007/0058432 A1 * | 3/2007 | Hosono ................. 365/185.11 |

FOREIGN PATENT DOCUMENTS

JP  2005-142493  6/2005

OTHER PUBLICATIONS

Tomoharu Tanaka, et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.

* cited by examiner

Primary Examiner—Gene Auduong
(74) Attorney, Agent, or Firm—Oblon, Spivak, McClelland, Maier & Neustadt, P.C.

(57) ABSTRACT

According to one embodiment of this invention, a non-volatile semiconductor memory device of high speed program operation is realized. It provides a non-volatile semiconductor memory device comprising a cell array in which NAND strings having electrically re-programmable memory cells are connected in series are disposed in a matrix form; sense amplifiers for sensing threshold voltages of said memory cells by sensing potentials of bitlines connected to said memory cells and for having a first region having high voltage transistors and a second region having low voltage transistors; cell source lines connected to an end of said NAND strings; and a first cell source line driver being connected to said cell source lines and having a first transistor for supplying a grounding potential or a low potential to said cell source line, said first transistor of said cell source line driver being disposed in said first region of said sense amplifiers.

20 Claims, 18 Drawing Sheets

NON-VOLATILE SEMICONDUCTOR MEMORY DEVICE

CROSS-REFERENCE TO RELATED APPLICATIONS

This application is based upon and claims the benefit of priority from the prior Japanese Patent Applications No. 2005-118596, filed on Apr. 15, 2005, the entire contents of which are incorporated herein by reference.

TECHNICAL FIELD

This invention relates to a semiconductor memory device which is electrically rewritable, and in particular relates to a NAND cell type EEPROM (NAND type flash memory), one classification of non-volatile semiconductor memory devices.

BACKGROUND TO THE INVENTION

Recently, the demand for small-sized large capacity non-volatile semiconductor memory devices has rapidly increased, above all, a NAND type flash memory that can be expected to be integrated on a large scale and massively stored by connecting a plurality of memory cells in series to compose a NAND cell block as compared with a conventional NOR type flash memory. The data program and erasure operations of the NAND type flash memory are as follows:

The data program operation of the NAND type flash memory is sequentially performed from a memory cell at the farthest position from a bitline. First, if the data program operation is started, 0V ("0" data programming) or a power supply voltage Vcc ("1" data programming) is applied to the bitline in response to the programming data, and Vcc is given to the selected gate line on the selected bitline side. In this case, when the bitline is at 0V, a channel part inside the NAND cell is fixed at 0V through the selected gate transistor in the connected selected NAND cell. When the bitline is at Vcc, after the channel part inside the NAND cell is charged by [Vcc-Vtsg] (however, Vtsg is the threshold voltage of the selected gate transistor) through the selected gate transistor, the channel part is in a floating state in the connected selected NAND cell. Subsequently, the voltage of a control gate line of the selected memory cell inside the selected NAND cell is increased from 0V to Vpp (=about 20V: high voltage for programming), and the voltage of a control gate line of the non-selected memory cell inside the selected NAND cell is increased from 0V to Vmg (=about 10V: intermediate voltage).

Here, when the bitline is at 0V, because the channel part inside the NAND cell is fixed at 0V in the connected selected NAND cell, a large potential difference is created across the gate (=Vpp potential) and the channel part (=0V) of the selected memory cell inside the selected NAND cell, electronic injection occurs from the channel part to the floating gate. This allows the threshold voltage of the selected memory cell to be shifted in a positive direction. This condition is a data "0".

On the other hand, when the bitline is at Vcc, because the channel part inside the NAND cell is in a floating state in the connected selected NAND cell, a potential of the channel part in floating state as it stands is increased from the [Vcc-Vtsg] potential to a Vmch (=about 8V), accompanied with a voltage build-up (0V->Vpp, Vmg) of the control gate line by the affection of capacitive coupling between the control gate line and channel part inside the selected NAND cell. In this case, because a potential difference between the gate (=Vpp potential) and channel part (=Vmch) of the selected memory cell inside the selected NAND cell is relative small (about 12V), electronic injection never occurs, therefore, the threshold voltage of the selected memory cell remains unchanged and a negative condition is kept. This condition is a data "1".

The data erasure of the NAND type flash memory is simultaneously performed on all the memory cells in the selected NAND cell block. Namely, all the control gates in the selected NAND cell block are fixed at 0V, the control gates and all the selected gates in the bitlines, source lines and non-selected NAND cell blocks are in a floating state, a high voltage of about 20V is applied to a p-type well (or p-type substrate). This releases electrons from the floating gates to the p-type well in all the memory cells inside the selected NAND cell block to shift the threshold voltage in a negative direction. Thus, the data erasure operation is designed to be performed by a block unit in batch in the NAND cell type flash memory.

The data read-out is performed by sensing whether or not current flows in the selected memory cell at a time when the voltage of the control gate in the selected memory cell is fixed at 0V, and the voltages (for example, 5V) of the control gates and selected gates in memory cells other than the former defined from stress at a time when read-out operation is performed on them are fixed.

Normally, the threshold voltage after the "0" data programming must be controlled in the scope of about 0V to about 4V. Therefore, re-programming data is set (verification by bit) so as to allow program verification to be performed, only memory cells in which "0" data programming is short to be sensed, and re-programming to be performed on only the memory cells in which "0" date programming is short. The memory cell in which "0" date programming is short is sensed by reading out the selected control gate at, for example, 0.5V (verification voltage) (verification read-out). Namely, if the threshold voltage of the memory cell is 0.5V or more with a margin to 0V, the current flows in the selected memory cell, and the shortage of "0" data programming is sensed. Program time is optimized to individual memory cells by performing data programming while repeating program operation and program verification, and the threshold voltage after "0" data programming is controlled in the scope of 0V to about 4V.

The operations of a conventional NAND flash memory as mentioned above are described in general, for example, in T. Tanaka, et al., "A Quick Intelligent Page-Programming Architecture and a Shielded Bitline Sensing Method for 3V-Only NAND Flash Memory", J. Solid State Circuits, Vol. 29, No. 11, pp. 1366-1372, November, 1994.

BRIEF SUMMARY OF THE INVENTION

The embodiment of this invention provides the non-volatile semiconductor memory device provided with the sense amplifier that senses the threshold voltage of the memory cell by sensing the potential of the cell array in which NAND strings where electrically re-programmable memory cells are connected in series are disposed in the shape of a matrix and that of the bitline connected to the memory cell and has a first region having a high-voltage transistor and a second region having a low-voltage transistor, the cell source line connected to one end of the NAND strings, and a first cell source line driver that is connected to the cell source line and has a first transistor that supplies a ground potential or low potential to the cell source line, and the first transistor of the cell source line driver is disposed in the first region of the sense amplifier.

DETAILED DESCRIPTION OF THE INVENTIONS

The source wiring (metal wiring) connected to the NAND string was disposed in a straight line shape between the memory cell arrays in a conventional NAND type flash memory. However, as the micronization of patterns advances, the micronization of spaces between memory cell arrays and metal wiring itself are also in progress, an increase in resistance of the metal wiring is steadily in question, accompanied therewith.

Then, as disclosed in the prior Japanese Patent Application No. 2003-379988 and Japanese Patent Application Laid Open No. 2005-142493), the inventors et al. proposed the technology that improves the resistance of the metal wiring by disposing the source wiring, for example, in the shape of a ladder, in the shape of a lattice or the like to mutually connect them and simultaneously disposing their wirings periodically in place of disposing the source wiring (metal wiring) that supplies the grounding potential or low-level potential Vss in a straight line shape between the memory cell arrays.

Figure 13:
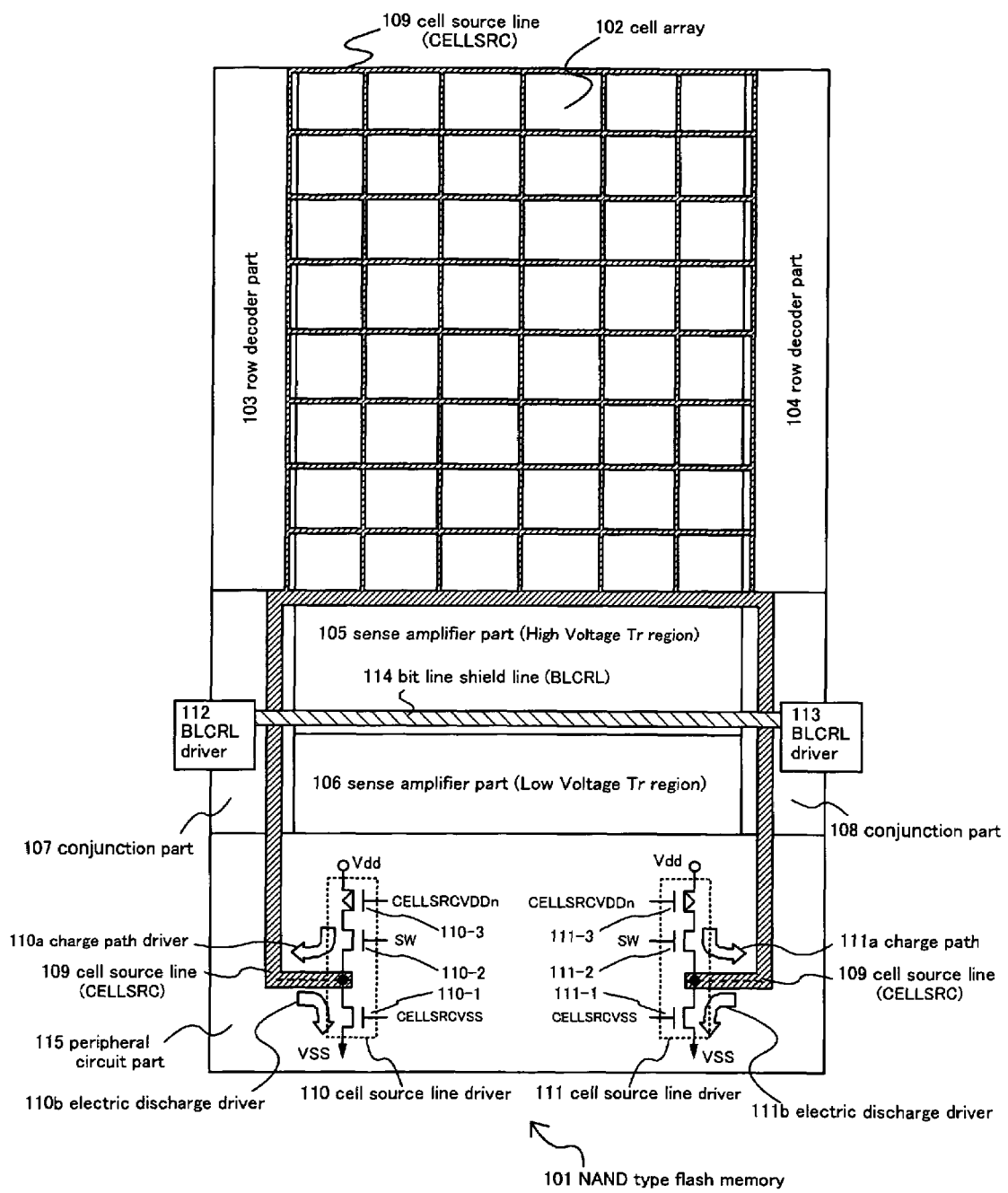
FIG. 13 is a block diagram of a NAND flash memory 101 in which a source wiring is disposed in the shape of a lattice, which is mutually connected, and simultaneous, their wirings are periodically disposed.

A block diagram of the NAND type flash memory 101 in which the source wiring (metal wiring) is disposed in the shape of a lattice, which is mutually connected and simultaneous, their wirings are periodically disposed is shown in FIG. 13. In addition, the circuit composition, circuit block, wiring pattern or the like are mixed and shown for the convenience of explanation in FIG. 13.

The NAND flash memory 101 shown in FIG. 13 is provided with the cell array 102 in which the memory cells are disposed in the shape of a matrix, the row decoder parts 103 and 104, the sense amplifier part (High Voltage Tr region) 105, the sense amplifier part (Low Voltage Tr region) 106, the conjunction part 107 with the row decoder part 103, and the sense amplifiers 105 and 106, the conjunction part 108 with the row decoder part 104, the sense amplifier parts 105 and 106, the cell source line (CELLSRC) 109, and the cell source line drivers 110 and 111, the bitline shield line (BLCRL) drivers 112 and 113, the bitline shield line (BLCRL) 114, and the peripheral circuit part 115. Here, the cell source line drivers 110 and 111 are provided at the peripheral circuit part 115, and the bitline shield line (BLCRL) drivers 112 and 113 are each provided at the conjunction parts 107 and 108.

Data read-out operation of the memory cells is performed by the sense amplifier circuit in the sense amplifier parts 105 and 106 in the NAND type flash memory 101. In addition, because the transistor of thick gate oxide film capable of withstanding high voltage (herein referred to as "high voltage transistor") is used, in the sense amplifier part (High Voltage Tr region) 105, the "High Voltage Tr region" is described. In addition, because the transistor to which a low voltage (herein referred to as "low voltage transistor") is applied is used in the sense amplifier part (Low Voltage Tr region) 106, as compared with the voltage applied to the high voltage transistor used in the sense amplifier part (High Voltage Tr region) 105, the "Low Voltage Tr region" is described. The sense amplifier part (High Voltage Tr region) 105 is provided between the cell array 102 and the sense amplifier part (Low Voltage Tr region) 106, as shown in FIG. 13.

The wiring of the cell source line 109 is disposed in the shape of a lattice on the cell array 102, which is mutually connected and simultaneously, their wirings are periodically disposed, as shown in FIG. 13. The cell source line driver 110 has a composition in which two n-channel type transistors 110-1 and 110-2 and one p-channel type transistor 110-3 are connected in series, and the cell source line 109 is electrically connected to the connect point to which the sources or drains of two n-channel type transistors 110-1 and 110-2 are mutually connected. Here, the n-channel type transistor 110-1 may be called "an electric discharge transistor", and the n-channel type transistor 110-2 and p-channel type transistor 110-3 may be called "a charge transistor", respectively. In addition, the cell source line driver 111 has the same composition as in the cell source driver 110, has a composition in which the two n-channel type transistors 111-1 and 111-2 and one p-channel type transistor 111-3 are connected in series, and the cell source line 109 is electrically connected to the connect point to which the sources or drains of the two n-channel transistors 111-1 and 111-2 are mutually connected.

As shown in FIG. 13, the cell source line 109 networked in the shape of a lattice is further extended over the cell array 102 running through the conjunction parts 107 and 108 up to the cell source drivers 110 and 111 disposed in the region of the peripheral circuit part 115. The cell source drivers 110 and 111 have the electric discharge paths (grounding paths) 110b and 111b (both shown in the outline arrows) to the VSS and the charge paths 110a and 111b (both shown in the outline arrows) that charge up the cell source line 109 at a voltage of about 1V. When the data is read out from the memory cell, the electric discharge paths 110b and 111b are turned ON to allow the cell source line 109 to be grounded. On the other hand, when the data is written in the memory cell (data program), the charge paths 110a and 111a are turned ON to allow the cell source line 109 to be precharged with electricity at about 1V. In addition, because a high voltage of about 20V is applied to the cell source line 109 when the data of the memory cell is erased, the cell source line drivers 110 and 111 that are the final stage circuits driving the cell source line 109, must be composed of high voltage transistors.

Figure 14:
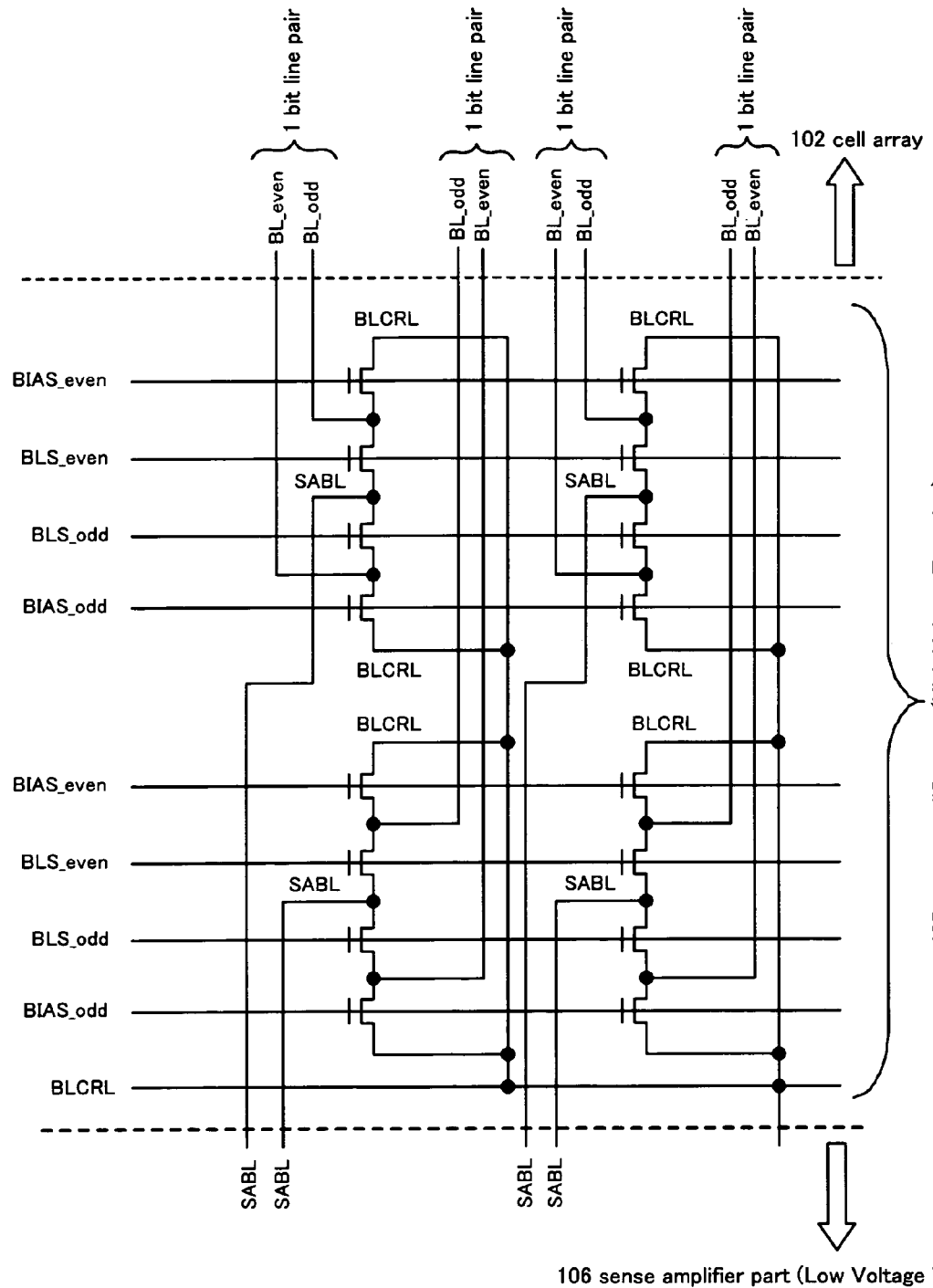
FIG. 14 is a circuit example of a sense amplifier part (High Voltage Tr region) 5 and a sense amplifier part (Low Voltage Tr region) 6 corresponding to four bitline pairs in the NAND type flash memory 101 shown in FIG. 13.

As shown in FIG. 14, a composition in which two bitlines (BL_odd and BL_even) are usually used as a pair and are connected to one sense amplifier disposed in the sense amplifier part 106 through a node of the SABL in FIG. 14 in the NAND type flash memory is adopted. In addition, when one bitline from the bitlines that are to be the pair is selected, a shield potential is supplied to the other bitline from a node of the BLCRL in FIG. 14 and the latter functions as a shield.

Figure 17:
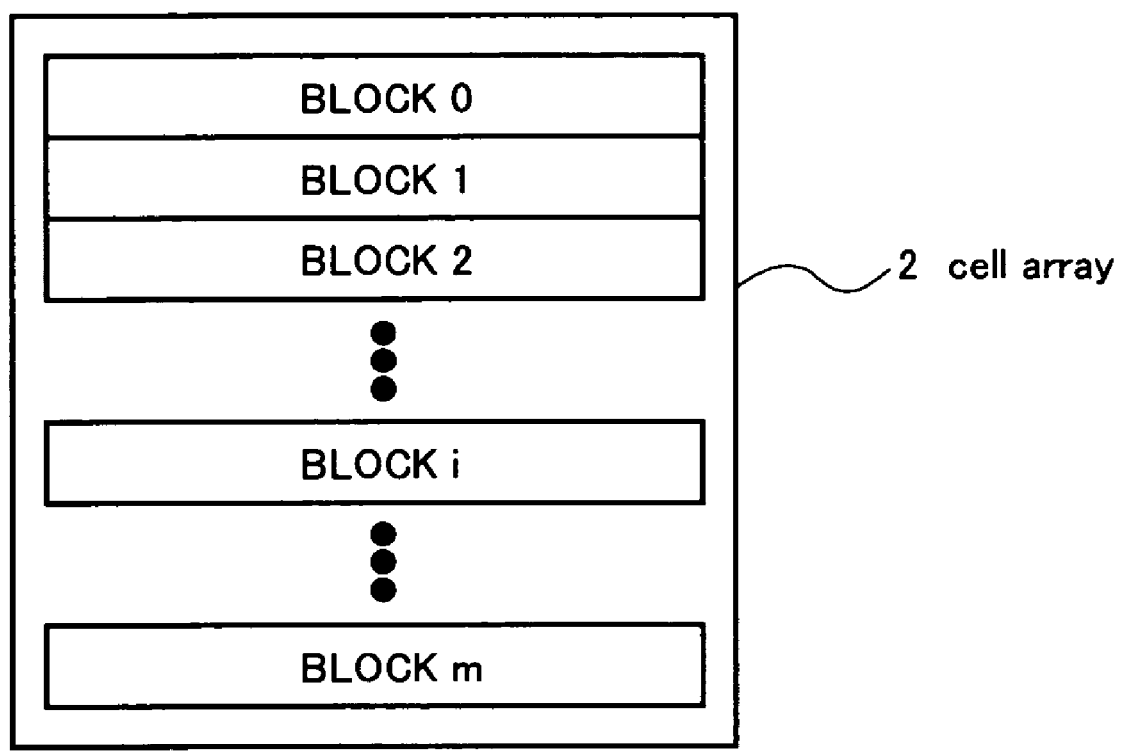
FIG. 17 shows a detailed configuration of cell array 2 in one embodiment of this invention.
Figure 18:
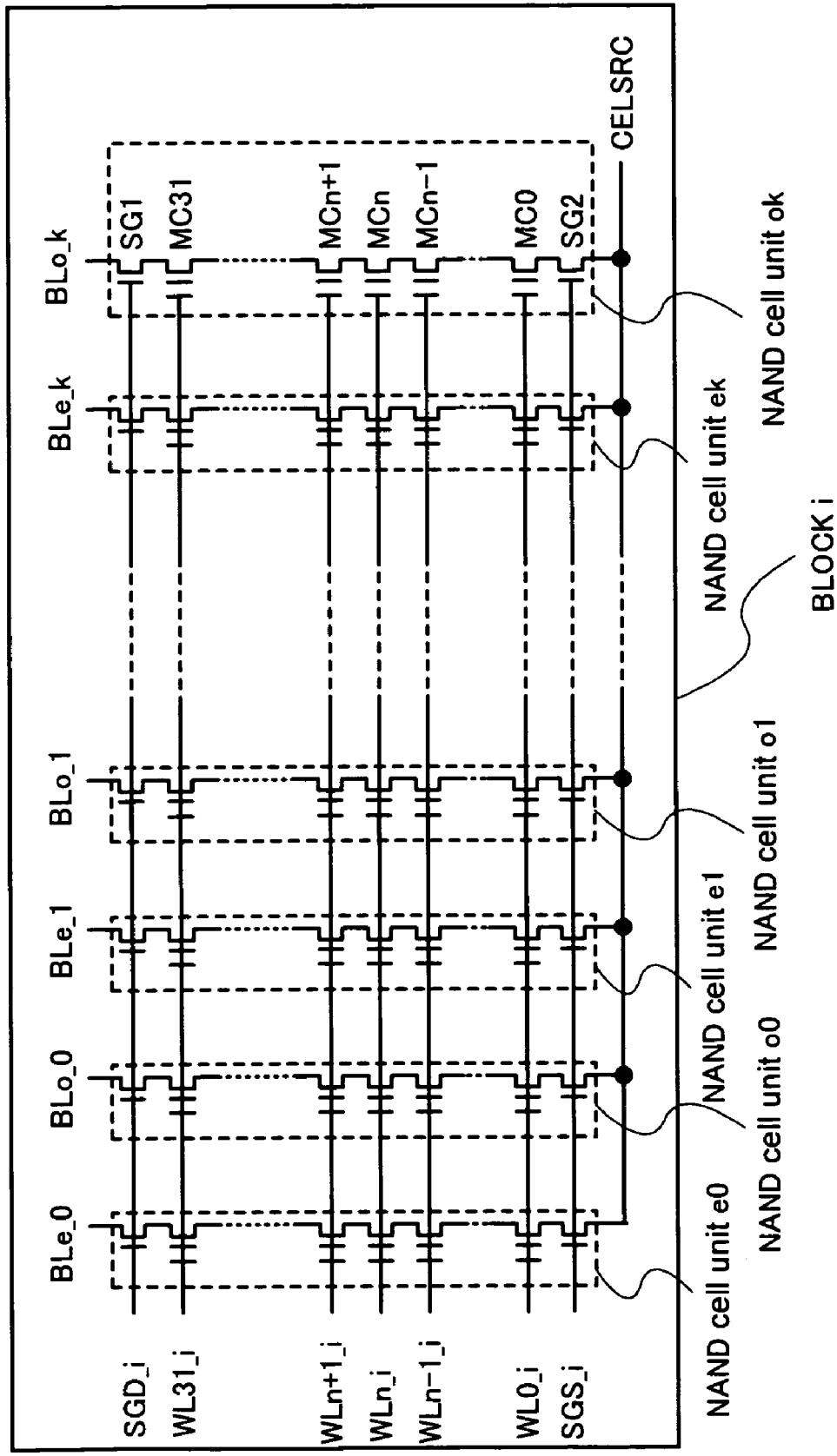
FIG. 18 shows a detailed configuration of a block in cell array 2 in one embodiment of this invention.

FIG. 17 shows a detailed configuration of cell array 2. The cell array 2 is divided into plural blocks. In one embodiment of this invention, as shown in FIG. 17, it is divided into m blocks (BLOCK0, BLOCK1, BLOCK2, . . . , BLOCKi, . . . BLOCKm). "Block" herein means a minimum unit for data erasure.

Figure 10:
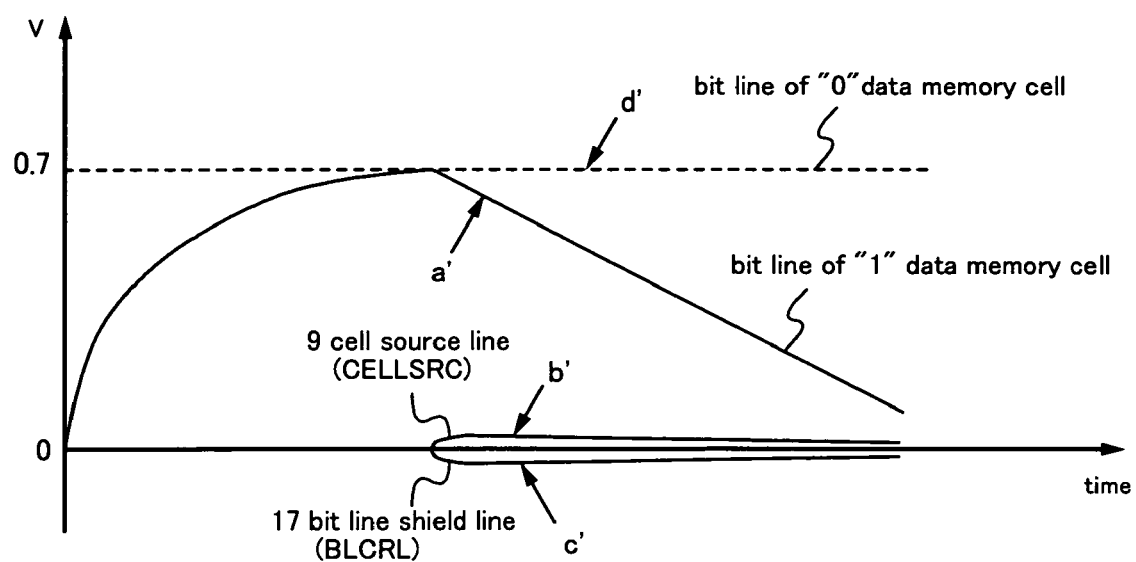
FIG. 10 is a graph showing changes in each potential of a "1" cell bitline in which a data "1" is stored, a "0" cell bitline in which a data "0" is stored, a cell source line (CELLSRC) 9, and a bitline shield line (BLCRL) 17 in reading out data from a memory cell of a NAND type flash memory in one embodiment of this invention.

Each of the blocks BLOCK0-BLOCKm, as represented by BLOCKi in FIG. 10, consists of 2×(k+1) NAND cell units e0-ok. Each of the NAND cell units consists of 32 memory cells MC0-MC31 connected in series, one end of which is connected to the bit line BL (even bit line BLe_0, odd bit line BLo_0, . . . , even bit line BLe_k, odd bit line BLo_k) through a selection gate transistor SG1 connected to a selection gate line SGD_i; and the other end of which is connected to a cell source line CELSRC through a selection gate transistor SG2 connected to a selection gate SGS_i. Control gates of each of the memory cell MC are connected to word lines WL (WL0_i–WL31_i) respectively. The bit line BL_e in even column and the bit line BL_o in odd column are subject to programming and reading independently from each other. Among 2×(k+1) memory cells connected to a single word line WL, memory cells connected to bit lines BL_e in even column are subject to programming and reading simultaneously. Each of the memory cells store two bits of data and k+1 memory cell constitute a unit called "a page".

Similarly, memory cells connected to a single word line WL, and connected to bit lines BL_o in odd column constitute another page and are subject to programming and reading simultaneously.

In one embodiment of this invention, there are m blocks of memory cells and each of the blocks include 2×(k+1) NAND memory cell units having 32 memory cells, however, the invention is not limited to this number and may be subject to variations of block numbers, memory cell numbers and memory unit numbers corresponding to a desired memory capacity.

Figure 15:
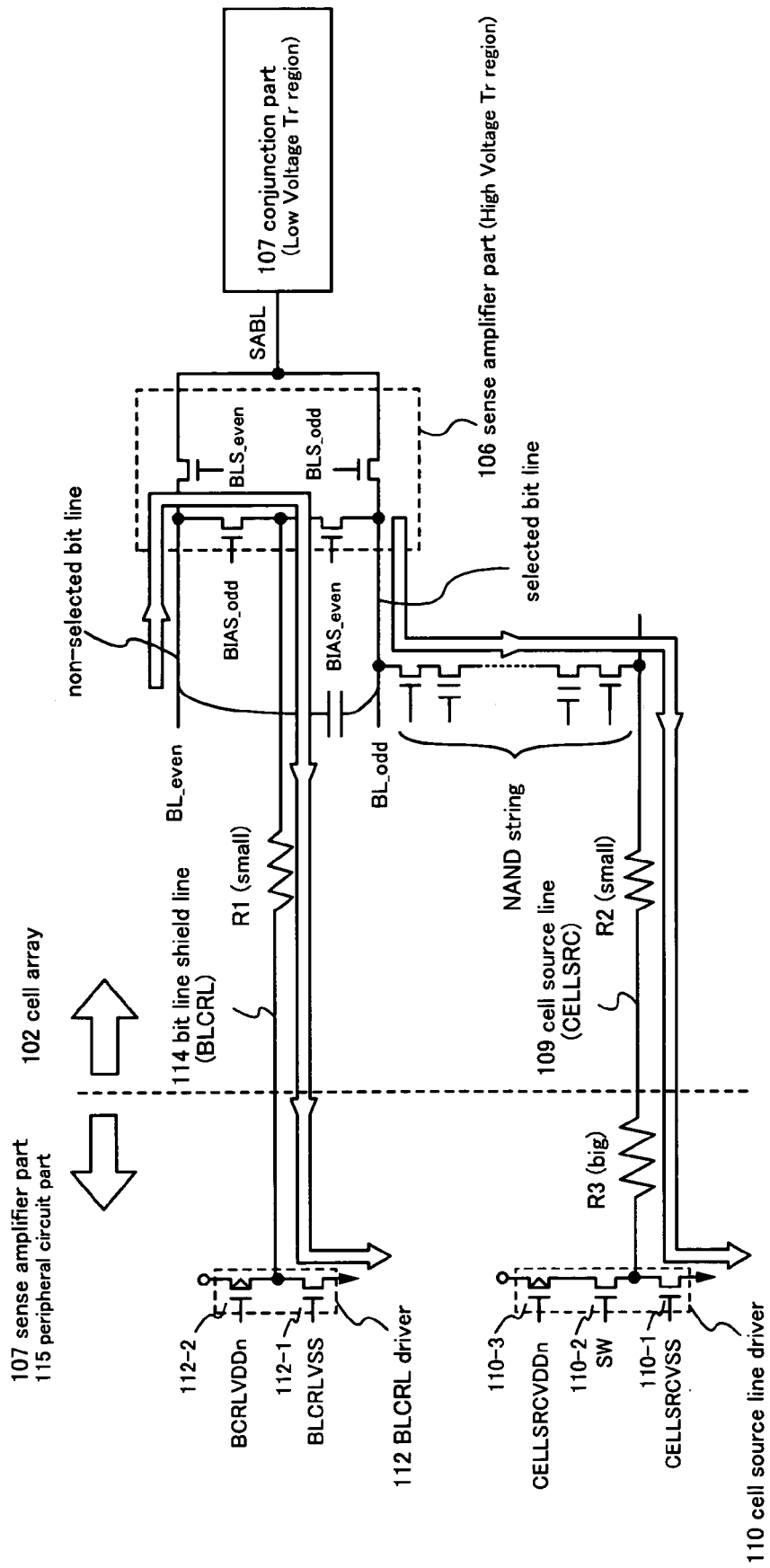
FIG. 15 is a circuit example of a sense amplifier part (High Voltage Tr region) 105 and a sense amplifier part (Low Voltage Tr region) 106 corresponding to one bitline pair out of the circuits shown in FIG. 14.

Refer to FIG. 15. A circuit example of the sense amplifier part (High Voltage Tr region) 105 and the sense amplifier part (Low Voltage Tr region) 106 corresponding to a 1 bitline pair out of the circuits shown in FIG. 14 is shown in FIG. 15. The circuit compositions of the BLCRL driver provided at the conjunction 107 and the cell source driver 110 provided at the peripheral circuit part 115 is also shown in FIG. 15. In addition, the flows of the current are shown in the outline arrows if BL_odd is defined as a selected bitline and BL_even is defined as a non-selected bitline to explain the flows of the current in the bitline shield line (BLCRL) 114 and cell source line (CELLSRC) 109 in FIG. 15.

As shown in FIG. 15, because electric discharge is performed from the precharge potential through the NAND string to the cell source line driver 110 on the selected bitline side, the current flows from the selected bitline BL_odd running through the NAND string via the cell source line (CELLSRC) 109 to the node which is connected to the VSS of the n-channel transistor 110-1 in the cell source line driver 110. On the other hand, because the non-selected bitline BL_even is made at a shield potential, the non-selected bitline BL_even is electrically connected to the BLCRL driver 112, the current flows from the non-selected BL_even via the bitline shield line (BLCRL) 114 to the node which is connected to the VSS of the n-channel transistor 112-1 in the BLCRL driver 112 on the non-selected side.

The wiring resistance R1 of the bitline shield line (BLCRL) 114 is relatively small. On the other hand, the wiring resistance R2 of the cell source line (CELLSRC) 109 present on the cell array 102 is also relatively small. However, the wiring resistance R3 of the source line (CELLRSC) 109 present on the conjunction part 107 and the peripheral circuit part 115 is relative large by a portion of the cell source line (CELLSRC) 109 further extended and networked.

On the contrary, in recent years, the acceleration of the data read-out operation from the memory cell is required in the NAND type flash memory. To realize the acceleration of the data read-out operation in the NAND flash memory, the resistance of the cell source line 109 must be reduced. In particular this is because the resistance of the cell source line at the time of electric discharge is big, an unnecessary potential rise occurs in the cell source line 109, thereby triggering the generation of noise in the bitline, resulting in the reduction of a sense margin in the memory cell.

Figure 16:
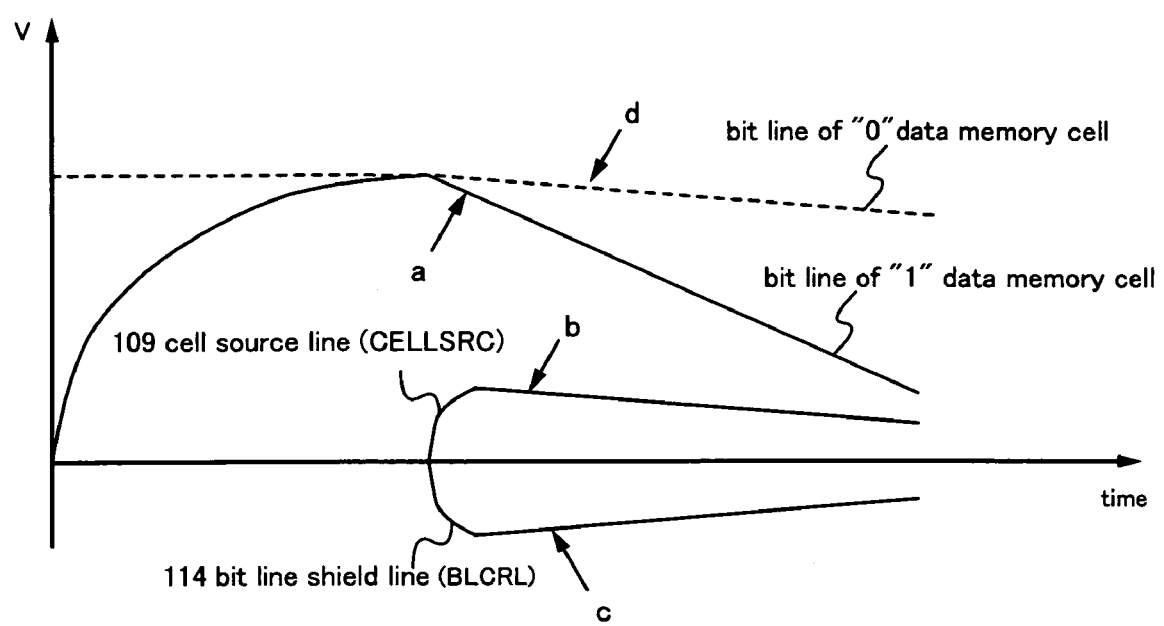
FIG. 16 is a graph showing changes in each potential of a "1" cell bitline in which a data "1" is stored, a "0" cell bitline in which a data "0" is stored, a cell source line (CELLSRC) 109, and a bitline shield line (BLCRL) in reading out data from a memory cell of the NAND type flash memory shown in FIG. 13.

Here, to explain the foregoing phenomenon, refer to FIG. 16. Changes in each potential of the "1" cell bitline in which the data "1" is stored, the "0" cell bitline in which the data "0" is stored, the cell source (CELLSRC) 109 and bitline shield (BLCRL) in reading out the data from the memory cell are shown in FIG. 16.

If the resistance of the cell source line 109 is big, a so-called cell current flows from the "1" cell bitline to the cell source line (CELLSRC) 109 (portion shown in "a" in FIG. 16), and an unrequired potential rises in the cell source line (CELLSRC) 109 (portion shown in "b" in FIG. 16, which may be called "cell source line noise"). In addition, by a drop in potential of the "1" cell bitline, the potential of the adjacent bitline that must be normally at a shield potential drops by coupling, thereby the potentials of the bitline shield lines (BLCRL) which are connected to all the shielded bitlines drop (portion shown in "c" in FIG. 16, which may be called "bitline shield line noise"). By the drop of the bitline shield line, the potential of the "0" cell bitline drops by the noise from the adjacent shielded bitline (portion shown in "d" in FIG. 16), the sense margin of the "0" cell is forced to be small. For example, in the condition that the data of all the memory cells except for one memory cell is "1", the bitline potential of the memory cell whose data is "0" is coupled with the VSS side through the potential of the bitline shield line, and the potential is forced to drop. Because the resistance of the cell source line 109 is big, such undesired rise/drop, that is, noise is generated, thereby the sense margin of the bitline is forced to be small, resulting in a serious affection on the data read-out operation.

The resistance of the cell source line 109 is mainly derived from its parasitic resistance. The parasitic resistance of the cell source line 109 is caused by the following three resistances:

(1) Resistance R(1) by the wiring on the cell array 102, (2) Resistance R(2) by the wiring on the conjunctions 107 and 108 with the sense amplifier parts 105 and the 106 and row decoders 103 and 104, and (3) ON resistance R(3) of the electric discharge transistors 110-1 and 111-1.

In connection with the (1) resistance R(1), for example, it is effective to widely cover the cell source line 109 on the cell array 102 with a second wiring layer (M2) to reduce the wiring resistance of the cell source 109. For example, the wiring resistance R(1) on the cell array is calculated as follows if it is assumed that the longitudinal width of the cell array 102 is 11000 μm, the lateral width is 2500 μm, the covering rate of the second wiring layer (M2) is 50%, and the sheet resistance is 0.06Ω/square:

Wiring resistance $R(1) = 0.06 \times 11000/(2500/2) = 0.53\Omega$

Next, in connection with the (2) resistance R(2), it is difficult to secure a sufficient wiring width of the cell source line 109 in the conjunction parts 107 and 108 with the sense amplifier parts 105 and 106 and the row decoders 103 and 104, because various kinds of wiring are congested in this portion. Therefore, it is difficult to realize the reduction of the resistance of the cell source line 109 in the conjunction parts 107 and 108. For example, the resistances R(2) of the cell source line 109 in the conjunction parts 107 and 108 are each calculated as follows if the cell source line 109 of height 450 μm and width 8 μm is disposed in the conjunction parts 107 and 108:

Wiring resistance $R(2) = 0.06 \times 500/8 = 3.75\Omega$

In addition, in connection with the (3) resistance R(3), the channel width W of the transistor may be increased to reduce the ON resistances of the electric discharge transistors 110-1 and 111-1. On the other hand, if the channel width W of the transistor is increased, the area overheads (so-call area share) of the electric discharge transistors 110-1 and 111-1 are large. Therefore, the channel width W is determined, considering that the dispositions of the electric discharge transistors 110-1 and 111-1 in the peripheral circuit part 115 and the sizes of the electric discharge transistors 110-1 and 111-1 in the entire peripheral circuit part 115. At present, the channel widths of the electric transistors 110-1 and 111-1 are determined so as to allow the ON resistances R(3) to be equivalent to that of the resistance R(2).

Finally, the wiring resistances R(2) on the conjunction parts with the (2) sense amplifiers 105 and 106 and the row decoders 103 and 104 occupy nearly half of the resistance of the entire cell source line 109. Therefore, to reduce the resistance of the cell source line 109, to minimize the wiring resistance R(2) on the (2) conjunction parts 107 and 108 are preferable.

FIRST EMBODIMENT OF THIS INVENTION

The non-volatile semiconductor memory device in one embodiment of this invention will be explained in detail below. In one embodiment of this invention, an example of the NAND type flash memory will be explained as the non-volatile semiconductor memory device in one embodiment of this invention.

Figure 1:
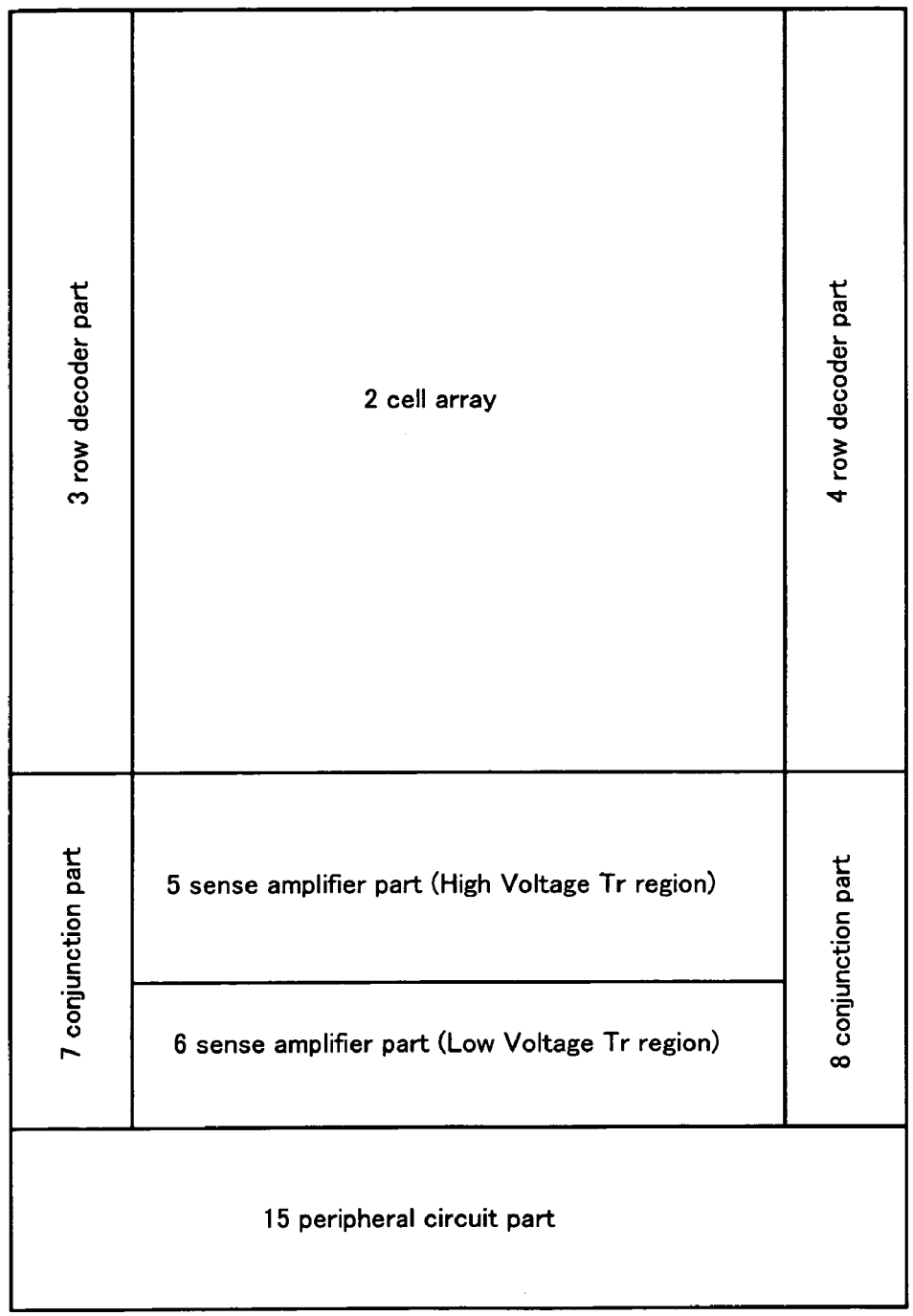
FIG. 1 is a block diagram of a NAND type flash memory 1 of one embodiment of this invention.

Refer to FIG. 1. An outline block diagram of the NAND type flash memory 1 which is one example of the non-volatile semiconductor memory device in one embodiment of this invention is shown in FIG. 1. The NAND type flash memory 1 shown in FIG. 1 is provided with the cell array 2 in which the memory cells are disposed in the shape of a matrix, the row decoder parts 3 and 4, the sense amplifier part (High Voltage Tr region) 5, the sense amplifier part (Low Voltage Tr region) 6, the conjunction part 7 with the row decoder part 3 and the sense amplifier parts 5 and 6, the conjunction part 8 with the row decoder part 4 and the sense amplifiers 5 and 6, and the peripheral circuit part 15.

Figure 2:
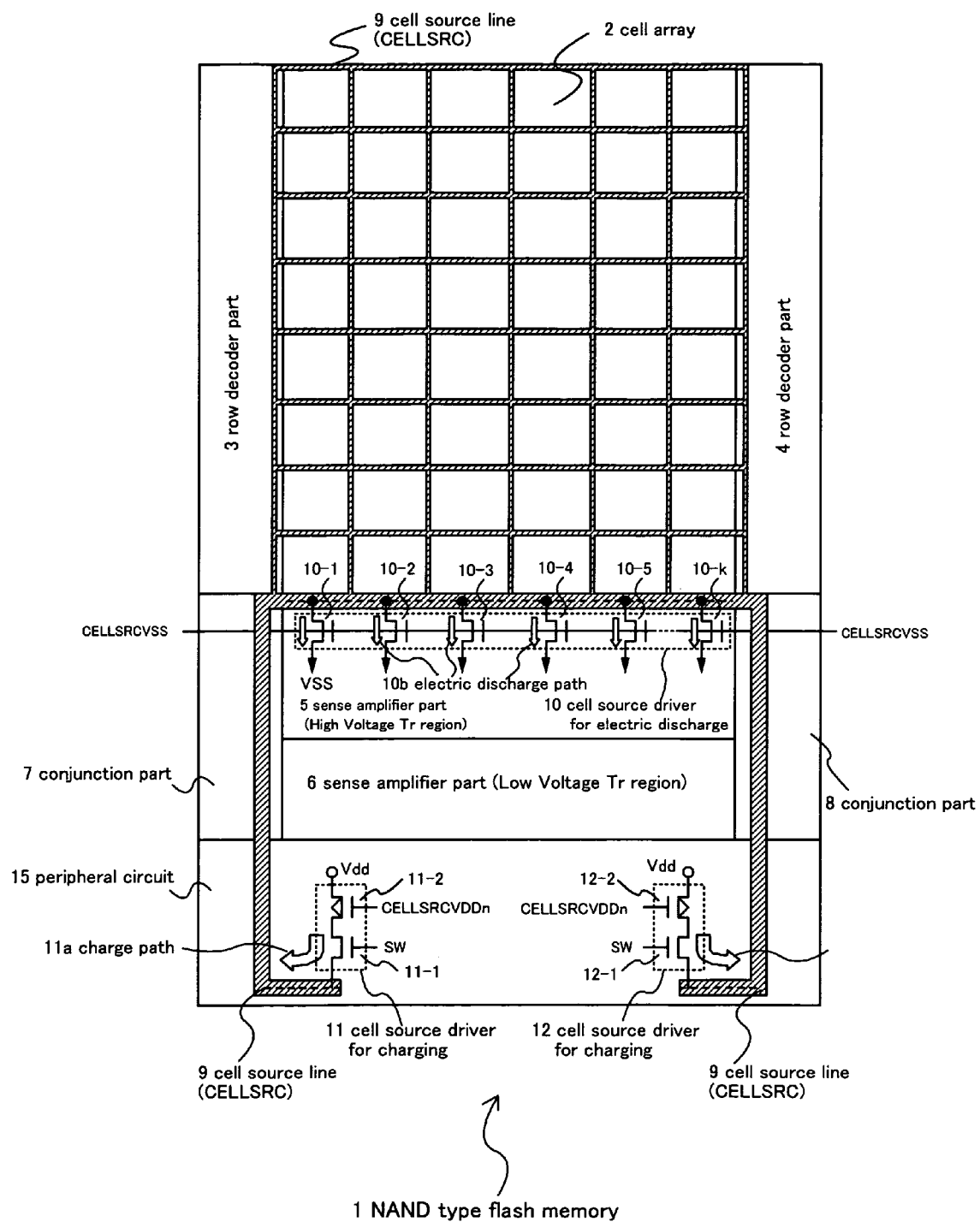
FIG. 2 is a composition figure showing more extensively a NAND type flash memory 1 of one embodiment of this invention.

Next, refer to FIG. 2. FIG. 2 is a composition figure showing more extensively the NAND type flash memory 1 in one embodiment of this invention. In addition, the circuit composition, the circuit block, the wiring pattern or the like are mixed and shown for the convenience of explanation in FIG. 1.

The NAND type flash memory 1 in one embodiment of this invention is provided with the cell source line (CELLSRC) 9, the cell source line driver for electric discharging 10, and the cell source line drivers for charging 11 and 12.

The cell source driver for electric discharging 10 has a plurality of n-channel type transistors 10-1 to 10-k (k is a natural number). These n-channel type transistors 10-1 to 10-k execute the electric discharge of the cell source line 109, and high voltage transistors are used. Here, the n-channel type transistors 10-1 and 10-k which compose the cell source line driver for electric discharging 10 is each called "a transistor for electric discharging". In the NAND type flash memory 1 in one embodiment of this invention, the cell source line driver for electric discharging 10 which is composed of the high voltage transistors, that is, the transistors for electric discharging 10-1 to 10-k are provided at the sense amplifier part (high Voltage Tr region) 5, and this is one of the features in one embodiment of this invention. In addition, design changes of the number and sizes (channel width and channel length) of the n-channel type transistors for electric discharging which compose the cell source line driver for electric charging 10 may be suitably made.

In the NAND type flash memory in one embodiment of this invention, the wiring resistance of the cell source line 109 at the conjunction parts 107 and 108 which is conventionally in question can be eliminated in the electric discharge path 10b electrically discharging to the transistors for electric discharge 10-1 to 10-k of cell source line driver 10 by disposing the cell source line driver for electric discharge 10 in the sense amplifier part (High Voltage Tr region) 5. Therefore, this allows the wiring resistance of the cell source line 109 at the time of electric discharge to be reduced, thereby enabling the system to suppress the generation of noise in the cell source line and bitline at the time of the data read-out, resulting in the acceleration of the data read-out operation.

On the other hand, the cell source drivers for charging 11 and 12 are provided at the peripheral circuit part 15. The cell source driver 11 has a composition in which one n-channel type transistor 11-1 and one p-channel type transistor 11-2 are connected in series, and the cell source line 109 is electrically connected to a connect point to which individual sources or drains are mutually connected. Here, the n-channel type transistor 11-1 and the p-channel transistor 11-2 are each called "the transistor for charging". In addition, the cell source line driver for charging 12 has the same composition as in the cell source line driver 11 and has a composition in which one n-channel type transistor 11-1 and one p-channel type 11-2 are connected in series, and the cell source line 109 is connected to a connect point to which individual sources or drains are mutually connected. In addition, the design of the number and sizes (channel width and channel length) of the n-channel type transistor and p-channel type transistor which compose the cell source line drivers for charging 11 and 12 may be changed.

In addition, as shown in FIG. 2, the cell source line (CELLSRC) 9 is formed by disposing the same line in the shape of a lattice on the cell array 2, which is mutually connected and simultaneously, their wirings which are periodically disposed in one embodiment of this invention. However, the shape of the cell source line (CELLSRC) 9 is not limited to this shape, a variety of shapes may be adopted, for example, the shape may be formed by disposing the same line in the shape of a ladder on the cell array, which is mutually connected and simultaneously, their wirings which are periodically disposed, in addition, the cell source line may be disposed on the memory cell array 2 in a straight line shape as in a conventional method.

In the NAND flash memory 1 of one embodiment of this invention, the potential of the bitline which is connected to the memory cell by the sense amplifier circuits in the sense amplifier parts 5 and 6 is sensed, thereby to sense the threshold voltage of the memory cell and perform the data read-out operation. In addition, a high voltage transistor is used in the sense amplifier part (High Voltage Tr region) 5, while a low voltage transistor is used in the sense amplifier part (Low Voltage Tr region) 6. The sense amplifier part (High Voltage Tr region) 5 is provided between the cell array 2 and the sense amplifier part (Low Voltage Tr region) 6, as shown in FIG. 1 and FIG. 2.

As shown in FIG. 2, the cell source line 9 is formed by disposing the same line in the shape of a lattice on the cell array 2, which is mutually connected and simultaneously disposing their wirings periodically. Because the cell source line driver 10 is composed of the n-channel type transistors only, if the sense amplifier part (High Voltage Tr region) 5 is composed of the n-channel type transistors only similarly, the high voltage transistors of n-channels can be densely disposed in the sense amplifier part (High Voltage Tr region) 5, thereby having a merit from the viewpoint of layout.

As shown in FIG. 2, the cell source line 9 networked in the shape of a lattice runs over the conjunction parts 107 and 108 from the cell array 2 and is further extended up to the cell source drivers 11 and 12 which are disposed in the region of the peripheral circuit 115. The cell source line driver 10 has the electric discharge path (grounding path) 10b (shown in the outline arrow) to the VSS. In addition, the cell source line drivers 11 and 12 have the charge paths 11a and 12a (both are each shown in the outline arrows) which charge up the cell source line 9 at a voltage of about 1V.

Figure 3:
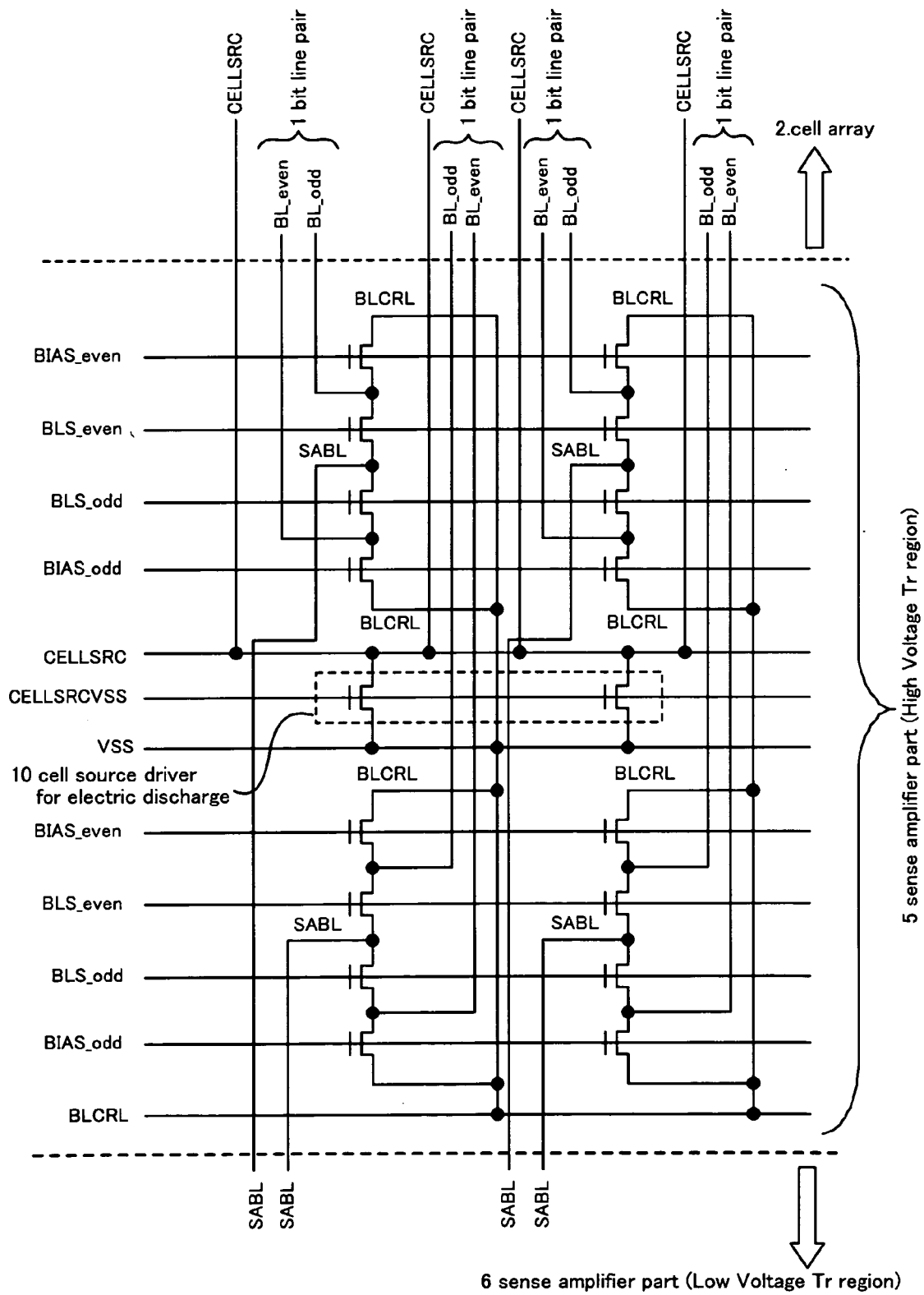
FIG. 3 is a circuit example of a sense amplifier part (High Voltage Tr region) 5 and a sense amplifier part (Low Voltage Tr region) 6 corresponding to four bitline pairs in one embodiment of this invention.

When the data is read out from the memory cell, the electrical discharge path 10b is turned ON to ground the cell source line 9 (VSS). On the other hand, when the data is written in the memory cell (data program), the charge paths 11a and 12a are turned ON to precharge the cell source line 9 at about 1V. In addition, because a high voltage of about 20V is applied to the cell source line 9 to erase the data of the memory cell, the cell source line drivers 11 and 12 which are the final stage circuits for driving the cell source line 9 must be composed of high voltage transistors Next, refer to FIG. 3 and FIG. 4. A circuit example of the sense amplifier part (High Voltage Tr region) 5 and the sense amplifier part (Low Voltage Tr region) 6 corresponding to the four bitline pairs in one embodiment of this invention are shown in FIG. 3. The circuit blocks corresponding to one bitline pair are disposed in such a condition that the blocks are stacked, which composes the sense amplifier part (High Voltage Tr region) 5, as shown in FIG. 3. The cell source line driver 10 (transistor for electric discharging) is disposed between the circuit block corresponding to the 1 bitline pair and the circuit block corresponding to the adjacent 1 bitline pair in one embodiment of this invention, as shown in FIG. 3. However, the disposition thereof is not limited to this pattern only, for example, the driver may be disposed between the circuit block corresponding to two 1 bitline pairs and adjacent two 1 bitline pairs. In addition, one transistor for electric discharging is designed to correspond to the two bitline pairs in one embodiment of this invention. However, one embodiment of this invention is not limited to this composition, design changes of the number and sizes (channel width and channel length) of the transistor for electric discharging may be suitably made.

Figure 4:
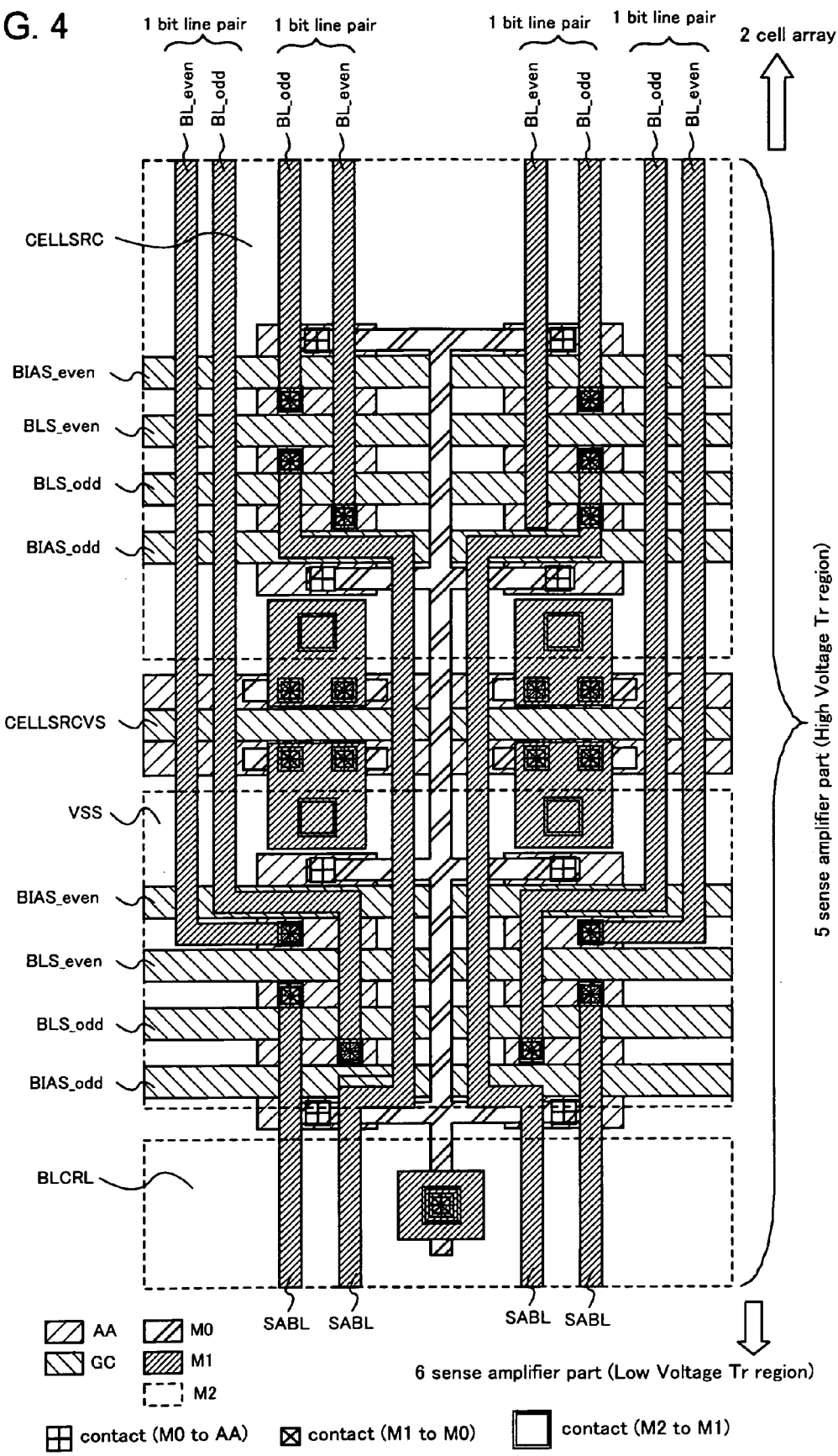
FIG. 4 is a layout image example of a sense amplifier part (High Voltage Tr region) 5 and a sense amplifier part (High Voltage Tr region) 6 corresponding to four bitline pairs in one embodiment of this invention.

Next, a layout image example of the sense amplifier part (High Voltage Tr region) 5 and the sense amplifier part (Low Voltage Tr region) 6 corresponding to the four bitline pairs is shown in FIG. 4. "AA" shows an active region, "GC" a gate wiring, "MO" a first wiring layer, "M1" a second wiring layer, and "M2" a third wiring layer, respectively in FIG. 4. In addition, each contact from MO to AA, from M1 to MO, and from M2 to M1 is shown using the marks shown in the Figure.

M2 by the wiring as spread of a metal (for example, aluminum) is used for the cell source line (CELLSRC) 109. Therefore, because the transistors for electric discharge of the cell source line driver 10 drops a contact from M2 to M1, they are disposed in a portion in which the disposition of the bitline (by M1) extending from the cell array 2 is relaxed. The portion which is relaxed is in the vicinity of the center of the sense amplifier part (High Voltage Tr region) 5 in one embodiment of this invention, as shown in FIG. 4.

As in the NAND flash memory 1 in one embodiment of this invention, the VSS wiring is newly extended by M2 by disposing the transistor for electric discharging of the cell source driver 10 in the high voltage transistor region 5 in the sense amplifier part, the resistance of the VSS is added as a resistance in the electric discharge path. Therefore, the subject is how to minimize the resistance of the VSS resistance.

Because the high voltage transistor region 5 in the sense amplifier part usually has the height of about 100 μm, the width of the VSS wiring of about 40 μm can be secured. If so, the wiring resistance RVSS of the VSS wiring is calculated as follows:

$$RVSS=0.06\times2500/40/2=1.88\Omega$$

As a result, if the resistance R(2) by the wiring on the conjunction parts 7 and 8 with the (2) sense amplifiers 5 and 6 and the row decoders 3 and 4 which is conventionally in question that can be eliminated is considered, this arrangement exerts the effect equivalent to halving the resistance R(2)

In addition, if the length of the cell array 2 in the word line direction (lateral direction) is shortened, the reduction effect of the wiring resistance is further significant. This is because the wiring resistance is reduced if the length is shortened as the word line runs in a lateral direction of the cell array 2 on the high voltage transistor region in the sense amplifier. In addition, the transistors for electric discharging can be laterally aligned in one row, thereby enabling the system to secure a sufficiently large channel width W to also suppress the ON resistance of the electric discharge transistors.

As stated above, in the NAND type flash memory 1 in one embodiment of this invention, the wiring resistance of the source cell source line 109 in the conjunction parts 7 and 8 which is conventionally in question can be eliminated in the electric discharge path 10b electrically discharging to the transistors for electric discharging 10-1 to 10-k of the cell source line driver 10. Therefore, as a result, the wiring resistance of the cell source line 109 at the time of electric discharge can be reduced, thereby enabling the system to suppress the generation of noise in the cell source line and bitline at the time of the data read-out to accelerate the data read-out operation.

SECOND EMBODIMENT OF THIS INVENTION

In one embodiment of this invention, an example in which the cell source line drivers for charging 11 and 12 are each disposed in the conjunction parts 7 and 8 will be explained in the NAND flash memory 1 in one embodiment of this invention.

Figure 5:
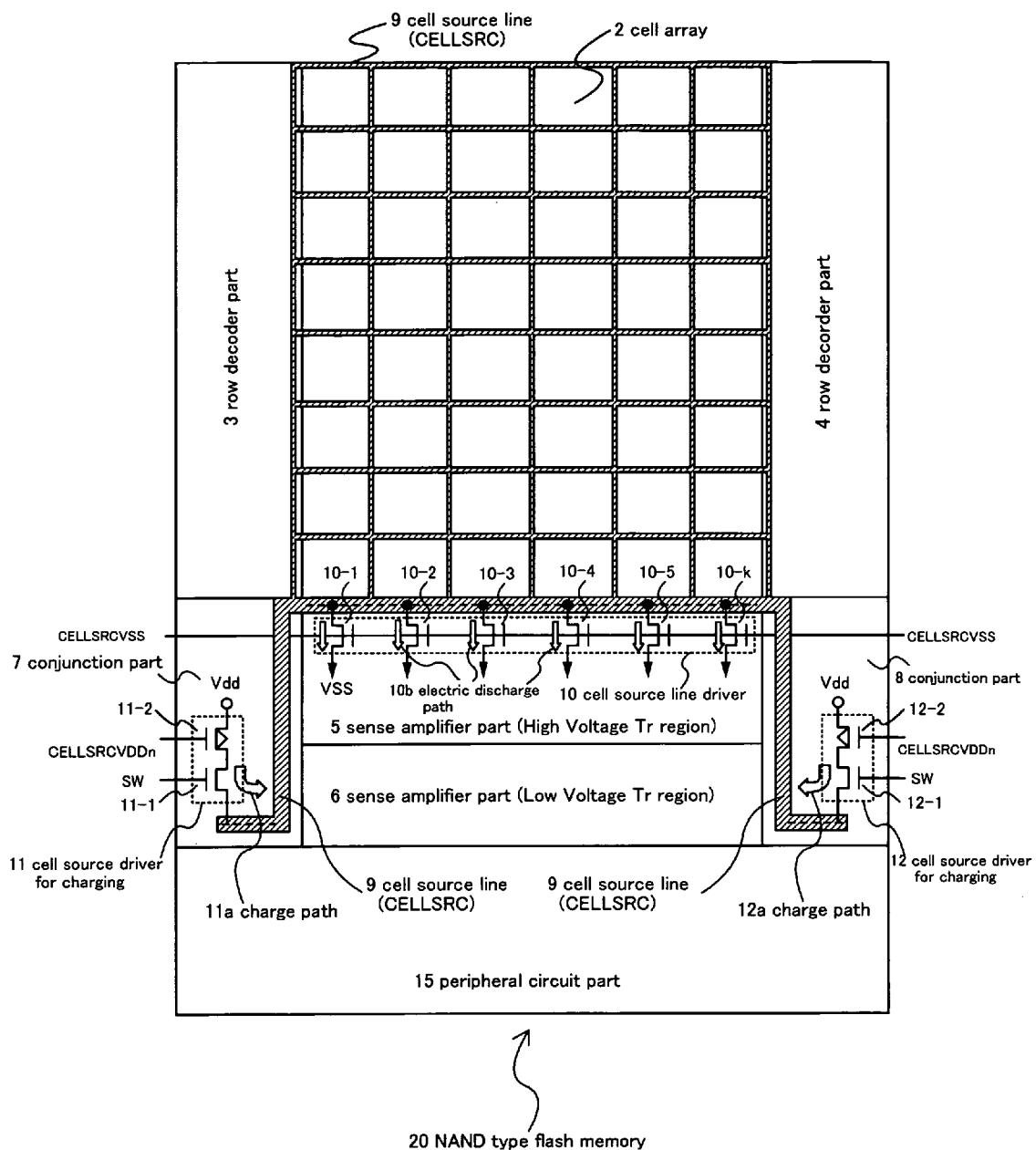
FIG. 5 is a block diagram of a NAND type flash memory 20 of one embodiment of this invention.

Refer to FIG. 5. The block diagram of the NAND flash memory in one embodiment of this invention is shown in FIG. 5. In addition, in the NAND flash memory 20 in one embodiment of this invention shown in FIG. 5, the same composition as in the NAND flash memory 1 in one embodiment of this invention is not explained here again because the same symbols are affixed thereto.

As shown in FIG. 5, the cell source line drivers for charging 11 and 12 are each disposed in the conjunction parts 7 and 8 in the NAND flash memory 20 of one embodiment of this invention. This allows the wiring of the cell source line (CELLSRC) 9 in the charge paths 11a and 12a to be shorter, thereby enabling the system to reduce the resistances of the charge paths 11a and 12a. In addition, because the other circuits are not so densely disposed in the conjunction parts 7 and 8 and a sufficient layout is provided, by disposing larger sized cell source line drivers for charging 11 and 12 in the conjunction parts 7 and 8, the area burden of the peripheral circuit part 15 is reduced, thereby enabling the system to increase the layout efficiency of the peripheral circuit 15, thus the layout efficiency of the entire NAND flash memory 20 can be increased.

THIRD EMBODIMENT OF THIS INVENTION

In one embodiment of this invention, an example in which the transistor that equalizes the potential of the cell source line (CELLSRC) and that of the bitline shield line (BLCRL) is disposed in the high voltage region of the sense amplifier part the nearest the cell array is explained in the NAND type flash memory 1 in one embodiment of this invention.

Figure 6:
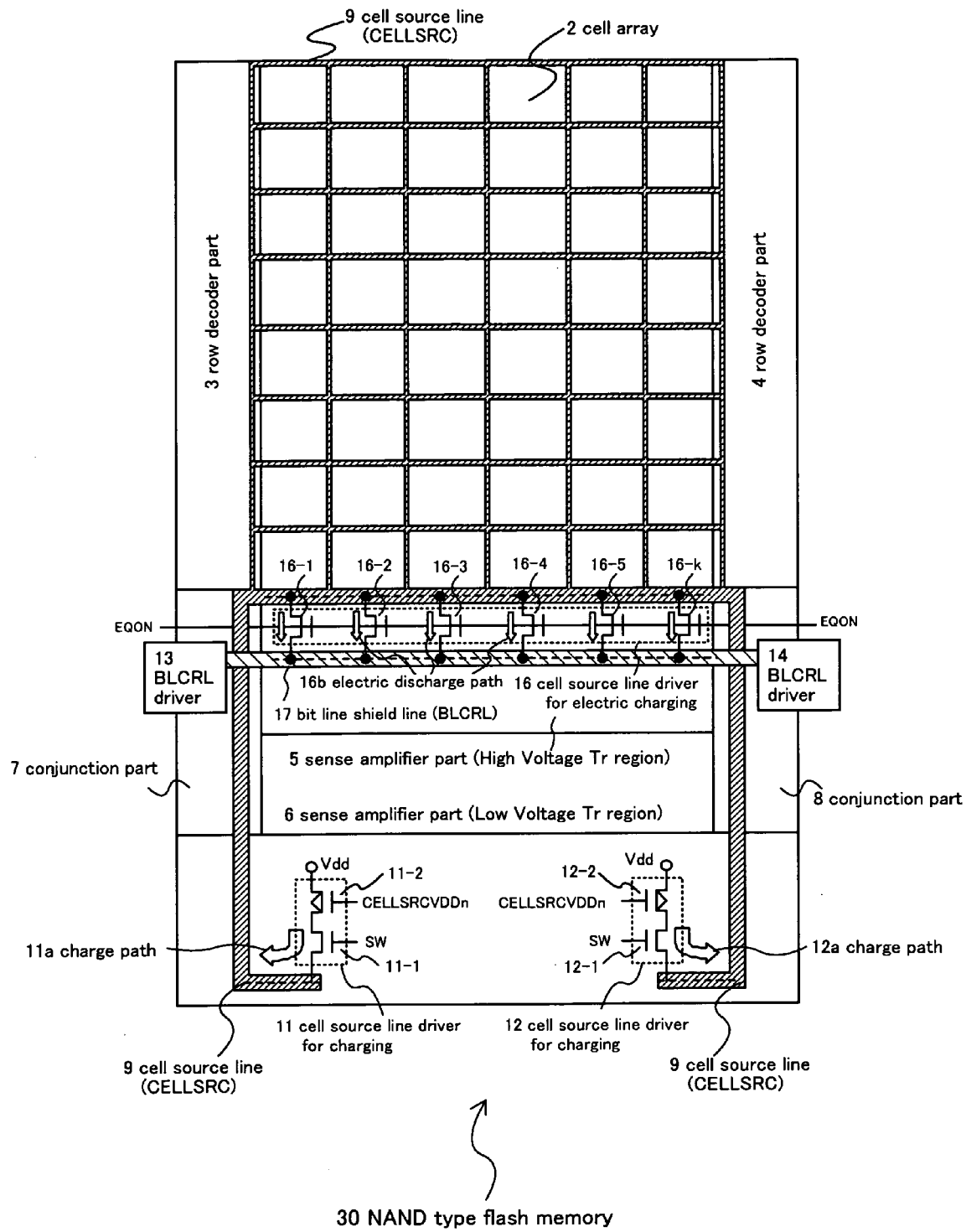
FIG. 6 is a block diagram of a NAND type flash memory 30 of one embodiment of this invention.

Refer to FIG. 6. The block diagram of the NAND type flash memory 30 in one embodiment of this invention is shown in FIG. 6. In addition, the same composition as in the NAND type flash memory 1 in one embodiment of this invention is not explained again here because the same symbols are affixed in the NAND type flash memory 30 in one embodiment of this invention shown in FIG. 6.

In the NAND type flash memory 30 of one embodiment of this invention, the cell source driver for electric discharging 16 which is composed of a plurality of the transistors (transistor for equalizing or transistor for electric discharging) 16-1 to 16-k that equalize the potential of the cell source line (CELLSRC) and that of the bitline shield line (BLCRL) is disposed in the sense amplifier part (High Voltage Tr region) 5 nearest the cell array 2. The bitline shield line (BLCRL) 17 is driven by the bitline shield line drivers 13 and 14 and is to be at the VSS potential. In addition, the number of the transistors for equalizing 16-1 to 16-k is not limited to this number, design changes of the sizes (Channel width and channel length) may also be suitably changed.

Figure 7:
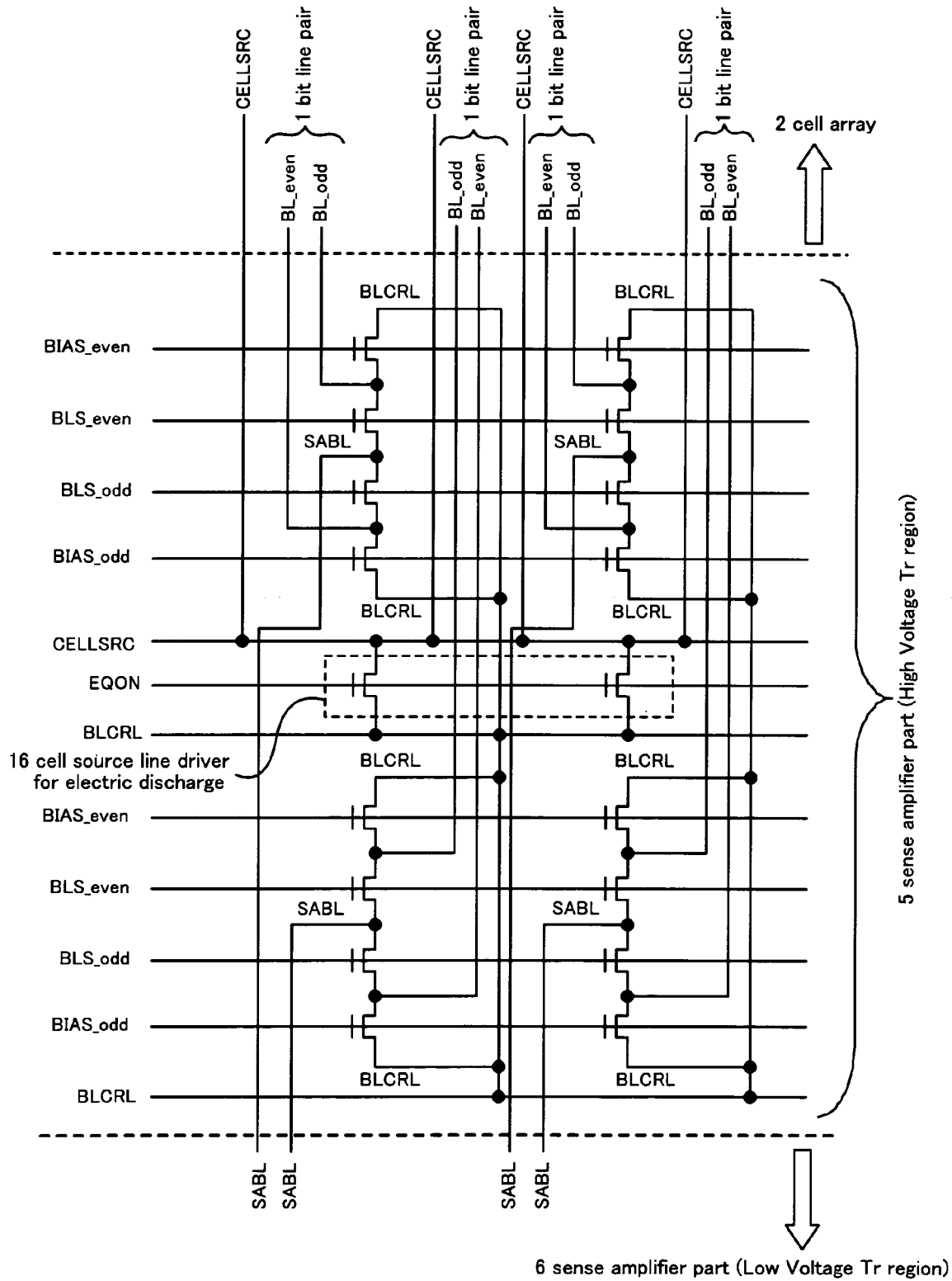
FIG. 7 is a circuit example of a sense amplifier part (High Voltage Tr region) 5 and a sense amplifier part (Low Voltage Tr region) 6 corresponding to four bitline pairs in one embodiment of this invention.

Next, refer to FIG. 7. A circuit example of the sense amplifier part (High Voltage Tr region) 5 and the sense amplifier part (Low Voltage Tr region) 6 corresponding to the four bitline pairs in one embodiment of this invention is shown in FIG. 7. The circuit blocks (for selecting corresponding bitlines) corresponding to one bitline pair are disposed in such a condition that they are stacked, and compose the sense amplifier part (High-Voltage Tr region), as shown in FIG. 7. As shown in FIG. 7, in one embodiment of this invention, the cell source line driver 10 (transistor for electric discharging) is disposed between the circuit block corresponding to the 1 bitline pair and the circuit block corresponding to the adjacent 1 bitline pair. However, it is not limited to this composition, for example, the driver may be disposed between the circuit block corresponding to two 1 bitline pairs and the circuit blocks corresponding to the adjacent two 1 bitline pairs. In addition, in one embodiment of this invention, one transistor for electric discharging is designed to correspond to two bitline pairs, which is not however limited to this composition, and design changes of the number and sizes (channel width and channel length) of the transistors for electric discharging (transistor for equalizing) may be suitably made.

Figure 8:
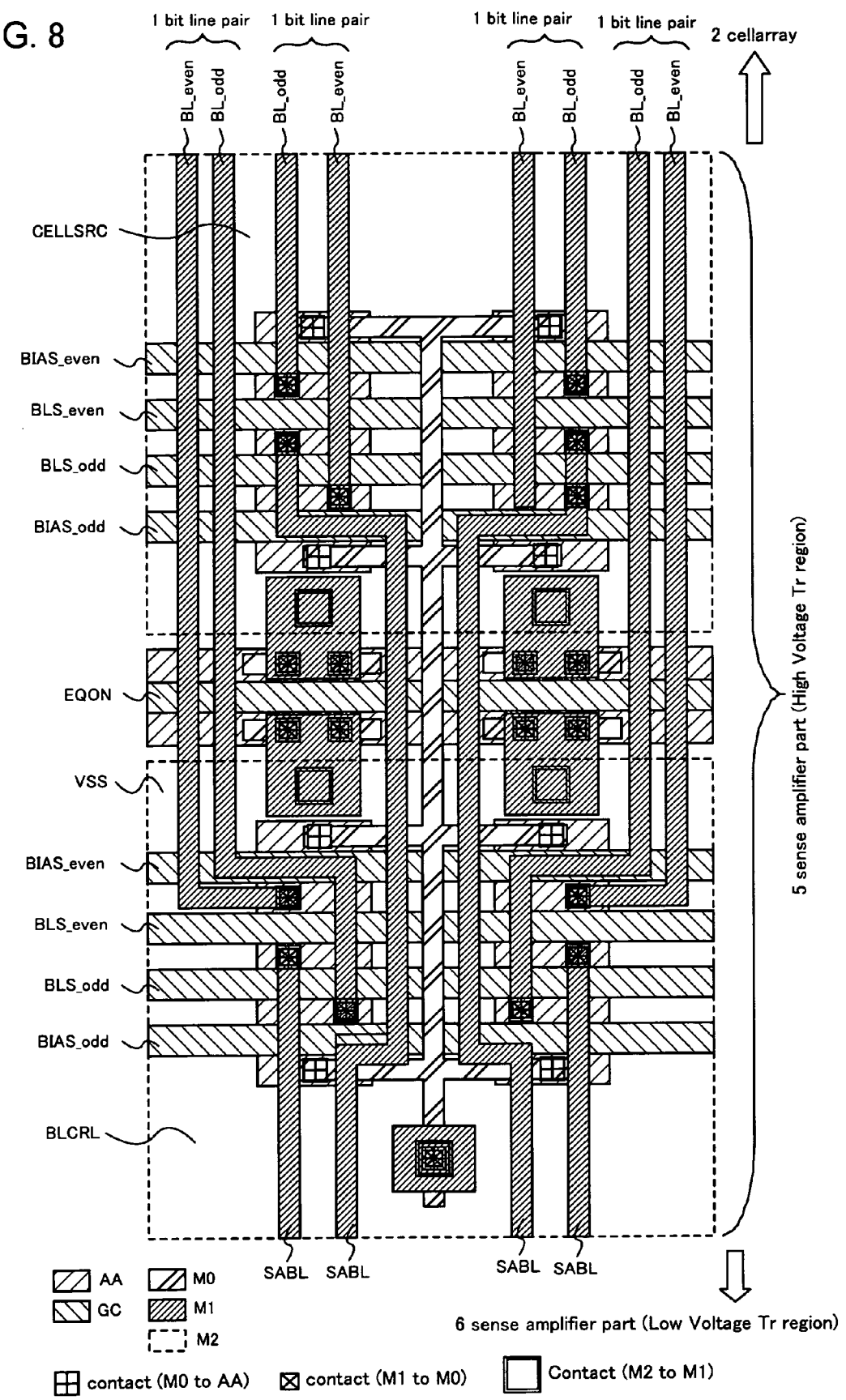
FIG. 8 is a layout image example of a sense Amplifier part (High Voltage Tr region) 5 and a sense amplifier part (High Voltage Tr region) 6 corresponding to four bitline pairs in one embodiment of this invention.

Next, a layout image example of the sense amplifier part (High Voltage Tr region) 5 and the sense amplifier part (Low Voltage Tr region) 6 corresponding to the four bitline pairs in one embodiment of this invention is shown in FIG. 8. "AA" shows the active region, "GC" the gate wiring, "MO" the first wiring layer, "M1" the second wiring layer, and "M2" the third wiring layer in FIG. 8, as in FIG. 4. In addition, the contacts from MO to AA, from M1 to MO, and from M2 to M1 are shown using the marks shown in the Figure, as in FIG. 4.

M2 by the wiring as spread of a metal (for example, aluminum) is used for the cell source line (CELLSRC) 9, the bitline shield line (BLCRL) and the VSS wiring. Therefore, because the transistor for electric discharging of the cell source line driver 10 drops a contact from M2 to M1, it is disposed in a portion in which the disposition of the bitline (by M1) extending from the cell array 2 is relaxed. The relaxed portion is located between the circuit block corresponding to the 1 bitline pair and the circuit block corresponding to the adjacent 1 bitline pair in one embodiment of this invention, as shown in FIG. 4.

Figure 9:
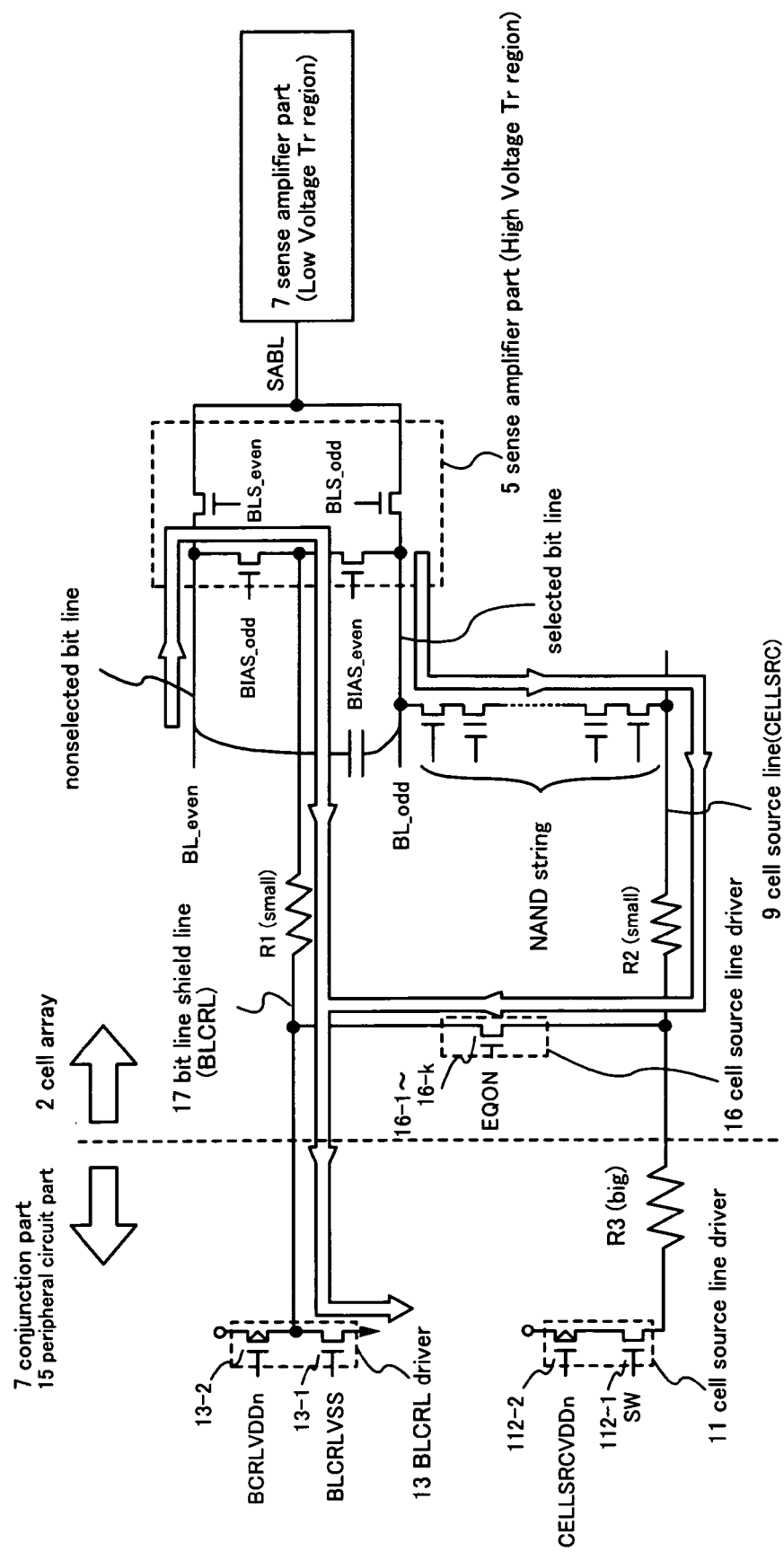
FIG. 9 is a circuit example of a sense amplifier part (High Voltage Tr region) 5 and a sense amplifier part (Low Voltage Tr region) 6 corresponding to four bitline pairs in one embodiment of this invention.

Here, refer to FIG. 9. The flow of the current when the potential of the cell source line (CELLSRC) 9 and that of the bitline shield line (BLCRL) 17 are equalized is explained In the NAND type flash memory 30 in one embodiment of this invention. A circuit example of the sense amplifier part (High Voltage Tr region) 5 and the sense amplifier part (Low Voltage Tr region) 6 corresponding to the 1 bitline pair out of the circuits shown in FIG. 7 and FIG. 8 is shown in FIG. 9. In addition, a circuit composition of the BLCRL driver 13 provided in the conjunction part 7 and the cell source line driver 11 provided in the peripheral circuit part 15 is also shown in FIG. 9. In addition, in FIG. 9, to explain the flow of the current in the bitline shield line (BLCRL) 17 and the cell source line (CELLSRC) 9, BL_odd is defined as the selected bitline, BL_even is defined as the non-selected bitline, the flow of the current is shown in the outline arrows when the potential of the bitline shield line (BLCRL) 17 and that of the cell source line (CELLSCR) 9 are equalized by the transistors for electric discharging 16-1 to 16-k of the cell source line driver 16.

As shown in FIG. 9, the non-selected bitline BL_even is connected to the line shield line 17 to supply the grounding potential VSS to the non-selected bitline BL_even from the BLCRL driver 13 at the time of the data read-out in the NAND type flash memory 30 in one embodiment of this invention. Simultaneously, the cell source line 9 on the selected bitline side is also grounded through the cell source driver 16 (transistors for equalizing 16-1 to 16-k). If it is explained based on the flow of the current, at the time of the data read-out, the current runs through the NAND string from the selected bitline BL_odd via the cell source driver 16 (transistors for equalizing 16-1 to 16-k) to the node connected to the VSS of the n-channel transistor 13-1 in the BLCRL driver 13. On the other hand, on the non-selected bitline side, the current runs through the bitline shield line (BLCRL) 13 from the non-selected bitline BL_even to the node connected to the VSS of the n-channel transistor 13-1 in the BLCRL driver 13.

The wiring resistance R1 of the bitline shield line (BLCRL) 13 is relatively small. On the other hand, the wiring resistance R2 of the cell source line (CELLSRC) 9 present on the cell array 2 is relative small. However, the wiring resistance R3 of the cell source line (CELLSRC) 9 present on the conjunction part 7 and the peripheral circuit part 15 is relatively large by a portion of the cell source line (CELLSRC) 9 that is networked and extended. Because a portion of large resistance out of the cell source line 9 is not used as a current path, the noise generated in the cell source line 9 can be suppressed in the NAND type flash memory 30 in one embodiment of this invention.

Here, refer to FIG. 10. The changes of the potentials in the "1" cell bitline in which the data "1" is stored, the "0" cell bitline in which the data "0" is stored, the cell source line (CELLSRC) 9 and the bitline shield line (BLCRL) 17 are shown in reading out the data from the memory cell in FIG. 10.

In the NAND type flash memory 30 in one embodiment of this invention, because the resistance of the cell source line 9 in the electric discharge path is small, the influx of the so-called cell current from the "1" cell bitline to the cell source line (CELLSRC) 9 can be suppressed, thereby enabling the system to suppress an unrequired potential rise of the cell source line 9 (portion shown in "b" in FIG. 10). In addition, the potential rise in the cell source line 9 and the potential drop in the bitline shield line 17 are correlated in reverse phase and are almost the same size. This is because about 92% of the bitline capacity is occupied by the adjacent bitline capacity. Therefore, the noise generated in the two wirings are almost cancelled by distributively disposing the transistors for equalizing 16-1 to 16-k to equalize the potential rise of the cell source line and the potential of the bitline shield line 17 nearest the cell array 2 (portions shown in "B2 and "c" in FIG. 10), thus, the noise level can be dramatically improved, leading to ¼ times the conventional level. Therefore, because the potential of the bitline shield line (BLCRL) 17 does not drop, the potential of the "0" cell bitline never drops by the noise from the adjacent shielded bitline (portion shown in "d" in FIG. 10), thus, never affecting the "0" cell sense margin.

Figure 11:
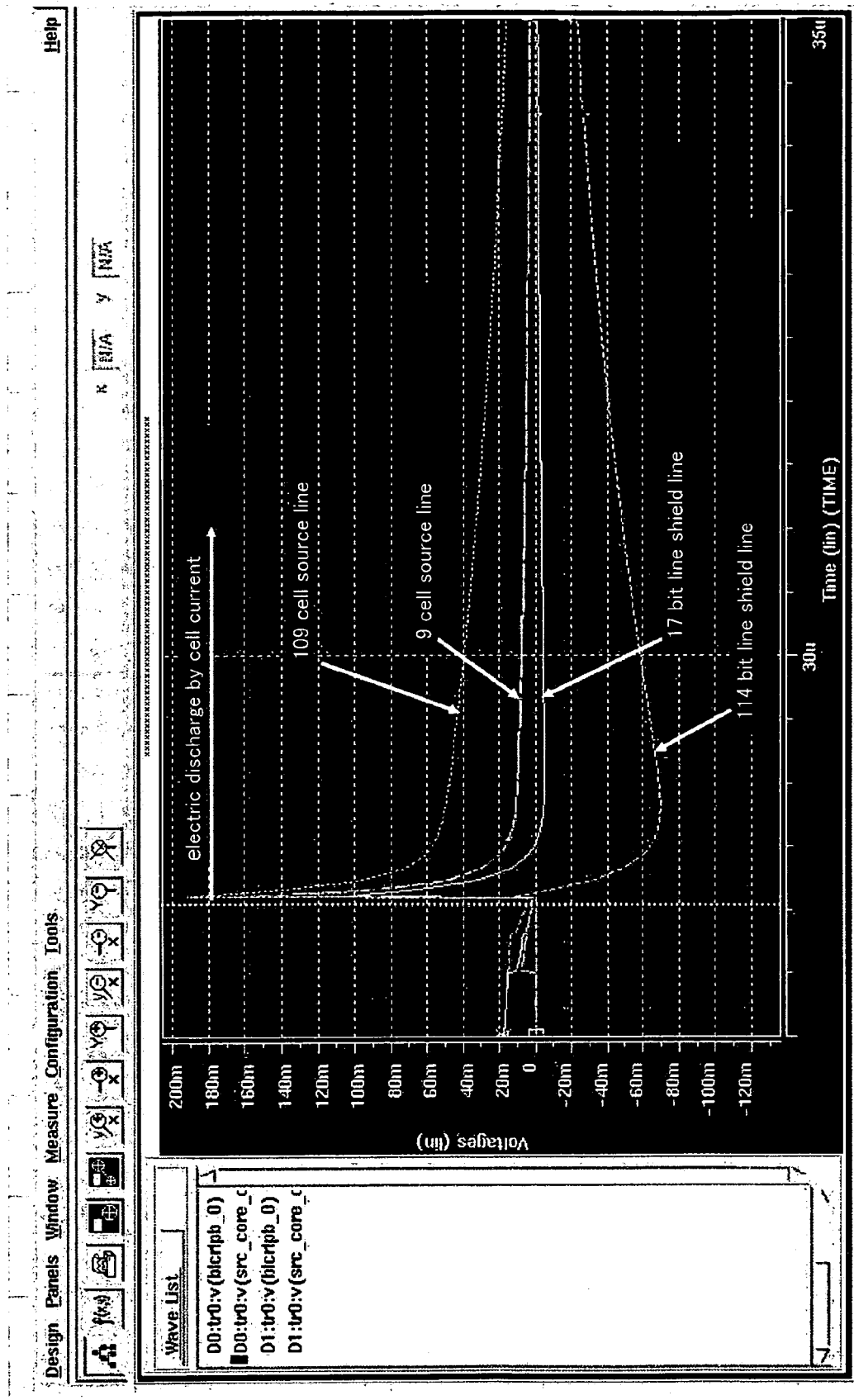
FIG. 11 is a computer simulation result of potential of a cell source line (CELLSRC) and a bitline shield line (BLCRL)

Here, FIG. 11 shows the computer simulation results of the changes in the potentials of the cell source line (CELLSRC) 9 and the bitline shield line (BLCRL) 17 in the NAND type flash memory 30 and those in the potentials of the cell source (CELLSRC) 109 and the bitline shield line (BLCRL) 114 of the NAND type flash memory 100 shown in FIG. 13 in one embodiment of this invention in reading the data from the memory cells. The potential rise appears in the cell source line (CELLSRC) 9 and the cell source line (CELLSRC) 109, and the potential drop appears in the bitline shield line (BLCRL) 17 and the bitline shield line (BLCRL) 114.

As is clear from FIG. 11, almost no potential rise is observed in the cell source line (CELLLSRC) 9 and almost no potential drop is observed in the bitline shield line (BLCRL) 17 of the NAND flash memory 30 in one embodiment of this invention. On the other hand, the potential significantly rises in the cell source line (CELLSRC) 109 and the potential significantly drops in the bitline shield line (BLCRL) 114 of the NAND type flash memory 100 shown in FIG. 13. These computer simulation results are matched with the results in FIG. 10 and FIG. 16.

In the NAND type flash memory in one embodiment of this invention, the noise generated in the two lines can be almost cancelled by distributively disposing the transistors for equalizing 16-1 to 16-k to equalize the potential rise of the cell source line 9 and the potential of the bitline shield line 17, thereby enabling the system to suppress the reduction of the cell current at the time of the data read-out to suppress the generation of noise in the cell source line and bitline to accelerate the data read-out operation at a high speed.

FOURTH EMBODIMENT OF THIS INVENTION

In one embodiment of this invention, in the NAND type flash memory 30 in one embodiment of this invention explained in the embodiment 3 above, the examples in which the cell source driver for charging 11 and 12 are each disposed in the conjunction part 7 and 8 are explained.

Figure 12:
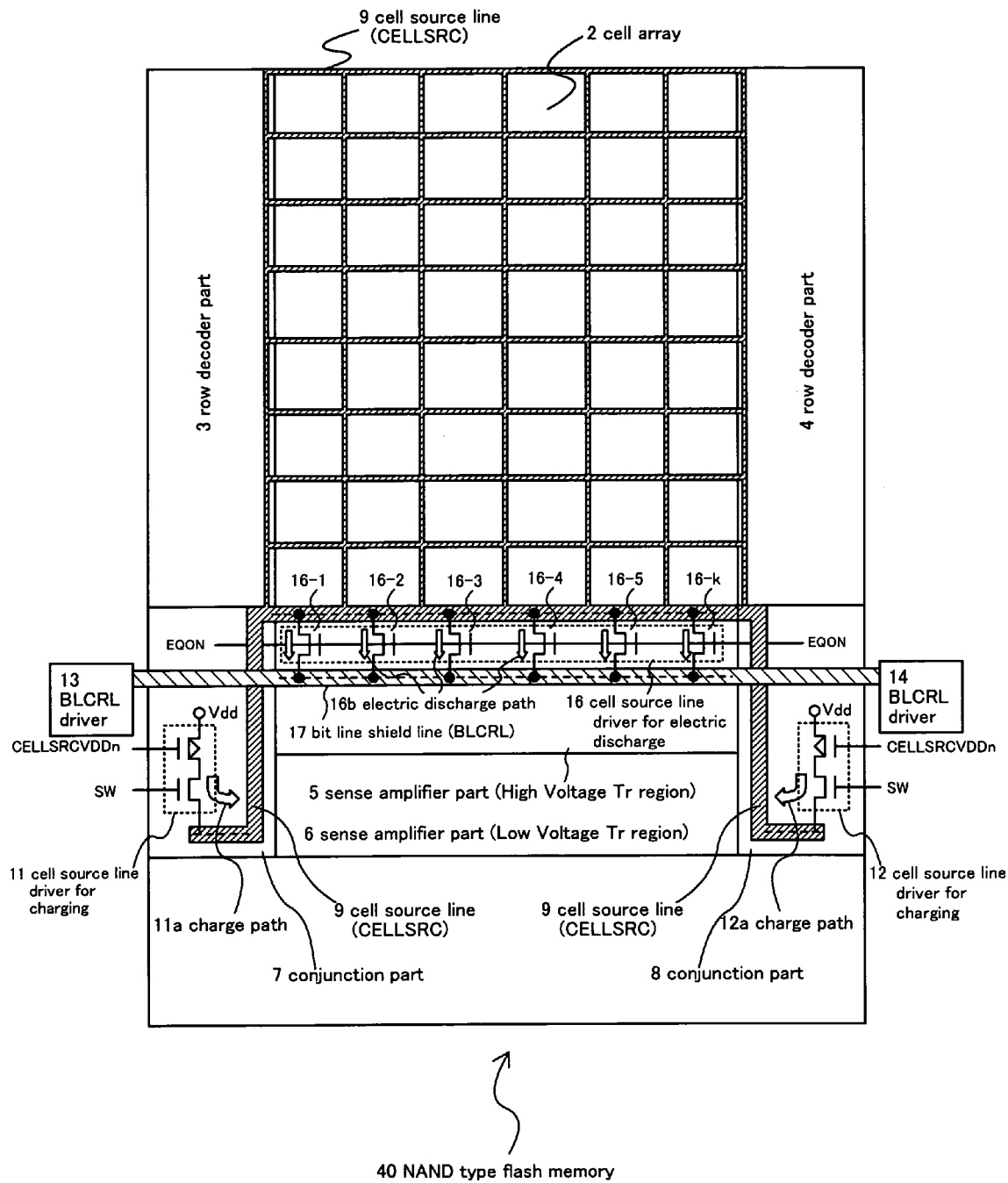
FIG. 12 is a block diagram of a NAND type flash memory 40 in one embodiment of this invention.

Refer to FIG. 12. The block diagram of the NAND type flash memory 40 in one embodiment of this invention is shown in FIG. 12. In addition, in the NAND type flash memory 20 in one embodiment of this invention shown in FIG. 12, the same compositions as in the NAND type flash memory 1 in one embodiment of this invention mentioned above and the embodiment 2 and the NAND type flash memory 30 in one embodiment of this invention are not explained again here because the same symbols are affixed.

As shown in FIG. 12, the cell source line drivers 11 and 12 for charging are each disposed in the conjunction part 7 and 8 in the NAND type flash memory 40 of one embodiment of this invention. This allows the wiring of the cell source line (CELLSRC) 9 in the charge paths 11a and 12a to be short, thereby enabling the system to reduce the resistances of the charge paths 11a and 12a. In addition, because normally, the other circuits are not so densely disposed in the conjunction parts 7 and 8 and a sufficient layout is provided, by disposing large-sized cell source line drivers for charging 11 and 12 in the conjunction parts 7 and 8, the area burden of the peripheral circuit part 15 is reduced, therefore, the layout efficiency of the peripheral circuit 15 can be increased, thereby enabling the system to raise the layout efficiency of the entire NAND type flash memory 40. Therefore, the system exerts an excellent effect in cooperation with the acceleration of the data read-out operation by suppressing the generation of noise in the cell source line and bitline by distributively disposing the transistors for equalizing 16-1 to 16-k to equalize the potential rise of the cell source line 9 and the potential of the bitline shield line 17.

The non-volatile semiconductor memory device in one embodiment of this invention can realize the acceleration of the program operation and can also realize the acceleration of the entire NAND type flash memory. Therefore, one embodiment of this invention can realize a cheaper, small-sized, high-speed, and large-capacity non-volatile semiconductor memory device. The non-volatile semiconductor memory device in one embodiment of this invention can be used, primarily for computers, as a memory device for electronic devices such as digital still camera, mobile phones, and electric appliances.

What is claimed is:

1. A non-volatile semiconductor memory device comprising:
    a cell array in which NAND strings having electrically re-programmable memory cells connected in series are disposed in a matrix form;
    sense amplifiers for sensing threshold voltages of said memory cells by sensing potentials of bitlines connected to said memory cells and having a first region having high voltage transistors and a second region having low voltage transistors;
    cell source lines connected to an end of said NAND strings; and
    a first cell source line driver being connected to said cell source lines and having a first transistor for supplying a grounding potential or a low potential to said cell source line, said first transistor of said cell source line driver being disposed in said first region of said sense amplifiers.

2. The non-volatile semiconductor memory device according to claim 1, wherein said cell source lines are formed within said cell array and are disposed in a lattice shape, which are mutually connected and are composed of wirings which are periodically disposed.

3. The non-volatile semiconductor memory device according to claim 1, wherein the device has a second cell source line driver having a second transistor which is connected to said cell source lines and supplies a high potential to said cell source lines, said second transistor being disposed in a conjunction part of said sense amplifiers and row decoders or a peripheral circuit.

4. A non-volatile semiconductor memory device provided with:
    a cell array in which NAND strings having electrically re-programmable memory cells connected in series are disposed in the shape of a matrix;
    sense amplifiers for sensing threshold voltages of said memory cells by sensing potentials of bitlines connected to said memory cells and having a first region having high voltage transistors and a second region having low voltage transistors;
    cell source lines connected to an end of said NAND strings; and
    a first cell source line driver, one end of which is connected to said cell source lines and the other of which is connected to a bitline shield line, said first cell source line driver having a first transistor for supplying ground potential or low potential to said cell source line through said bitline shield line, said first transistor of said cell source line driver being disposed in said first region of said sense amplifiers.

5. The non-volatile semiconductor memory device according to claim 4, wherein said cell source lines are formed within said cell array and are disposed in a lattice shape, are mutually connected, and are composed of wirings which are periodically disposed.

6. The non-volatile semiconductor memory device according to claim 4, wherein the device has a second cell source line driver having a second transistor being connected to said cell source lines and supplying high potential to said cell source lines, said second transistor being disposed in a conjunction part of said sense amplifiers and row decoders or a peripheral circuit.

7. A non-volatile semiconductor memory device comprising:
    a memory cell array having a plurality of non-volatile memory cells arranged in matrix form;
    cell source lines connected to said plurality of non-volatile memory cells;
    a sense amplifier part having a plurality of sense amplifiers for reading data from said memory cells, said sense amplifier part having a plurality of high voltage transistors formed in a high voltage transistor region and a plurality of low voltage transistors operable with a voltage lower than said high voltage transistors formed in a low voltage transistor region; and
    a cell source line driver having a plurality of first conductivity type transistors connected to said cell source lines, said plurality of first conductivity type transistors arranged between said memory cell array and said low voltage transistor region.

8. The non-volatile semiconductor memory device according to claim 7, wherein said first conductivity type transistors are arranged adjacent to said memory cell array.

9. The non-volatile semiconductor memory device according to claim 7, wherein said cell source line driver has a plurality of second conductivity type transistors connected to said cell source lines, said plurality of second conductivity type transistors arranged in a conjunction part adjacent to said high voltage transistor region and said low voltage transistor region.

10. The non-volatile semiconductor memory device according to claim 7, wherein said cell source line driver has a plurality of second conductivity type transistors connected to said cell source lines, said plurality of second conductivity type transistors arranged in a peripheral circuit part, said high voltage transistor region and said low voltage transistor region being arranged between said memory cell array and said peripheral circuit part.

11. The non-volatile semiconductor memory device according to claim 7, wherein said first conductivity type transistors are formed in said high voltage transistor region.

12. The non-volatile semiconductor memory device according to claim 11, further comprising:
first bit lines arranged across the memory cell array, and connected to a part of said memory cells;
second bit lines arranged across the memory cell array, and connected to another part of said memory cells;
a first circuit block for selecting said first bit lines; and
a second circuit block for selecting said second bit lines;
wherein said first conductivity type transistors are formed in a region between said first circuit block and said second circuit block.

13. The non-volatile semiconductor memory device according to claim 12, wherein said first bit lines include even bit lines and odd bit lines, and said second bit lines include other even bit lines and other odd bit lines.

14. The non-volatile semiconductor memory device according to claim 10, wherein said first conductivity type transistors are n-channel transistors, and said second conductivity type transistors are p-channel transistors.

15. The non-volatile semiconductor memory device according to claim 7, wherein groups of said memory cells are formed to be connected in series.

16. The non-volatile semiconductor memory device according to claim 10, wherein groups of said memory cells are formed to be connected in series.

17. The non-volatile semiconductor memory device according to claim 7, wherein said cell source line driver further has a third transistor having the first conductivity type, said third transistor being connected between second conductivity type transistors and said cell source lines.

18. The non-volatile semiconductor memory device according to claim 7, wherein said cell source lines are arranged in mesh form.

19. The non-volatile semiconductor memory device according to claim 10, wherein said cell source lines are arranged in mesh form.

20. The non-volatile semiconductor memory device according to claim 10, wherein a conjunction part is adjacent to a row decoder part having a plurality of row decoders.

* * * * *